(12) United States Patent
Nagai et al.

(10) Patent No.: US 7,525,871 B2
(45) Date of Patent: Apr. 28, 2009

(54) SEMICONDUCTOR INTEGRATED CIRCUIT

(75) Inventors: Takeshi Nagai, Yokohama (JP); Ryo Haga, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/738,858

(22) Filed: Apr. 23, 2007

(65) Prior Publication Data
US 2007/0195575 A1 Aug. 23, 2007

Related U.S. Application Data

(63) Continuation of application No. 10/726,544, filed on Dec. 4, 2003, now Pat. No. 7,266,025.

(30) Foreign Application Priority Data

Oct. 3, 2003 (JP) ............................. 2003-345975

(51) Int. Cl.
*G11C 19/00* (2006.01)
(52) U.S. Cl. .................... 365/240; 365/225.7; 365/200; 365/230.05; 365/94; 365/96; 365/221
(58) Field of Classification Search ............. 365/225.7, 365/200, 230.05, 94, 96, 221, 240
See application file for complete search history.

(56) References Cited

U.S. PATENT DOCUMENTS

| 4,506,385 A | 3/1985 | Fedde et al. | ............. 455/226.1 |
|---|---|---|---|
| 6,009,040 A | 12/1999 | Choi et al. | .................. 365/233 |
| 6,466,490 B2 * | 10/2002 | Nagai et al. | ............ 365/189.12 |
| 6,577,534 B2 | 6/2003 | Tsuruda | ................. 365/185.09 |
| 6,654,286 B2 | 11/2003 | Kawakami | ............. 365/185.21 |

FOREIGN PATENT DOCUMENTS

| JP | 2001-358313 | 12/2001 |
|---|---|---|
| JP | 2002-133895 | 5/2002 |
| JP | 2003-233999 | 8/2003 |

OTHER PUBLICATIONS

Michael R. Ouellette, et al., "Shared Fuse Macro for Multiple Embedded Memory Devices With Redundancy", IEEE 2001 Custom Integrated Circuits Conference, 2001, pp. 191-194.

(Continued)

*Primary Examiner*—Huan Hoang
*Assistant Examiner*—Fernando N Hidalgo
(74) *Attorney, Agent, or Firm*—Oblon, Spivak, McClelland, Maier & Neustadt, P.C.

(57) ABSTRACT

Fuse data is supplied to each of a plurality of function blocks through a transfer path using shift registers. When the reliability of fuse elements is low, there is a possibility that a part of the fuse data may have an error. Further, when the transfer path of the fuse data is long, there is a possibility that a value of the fuse data may be inverted due to an influence of noises. Thus, a decoder is arranged in the transfer path of the fuse data, and encoded data is stored in the fuse elements. By performing error detection/correction in the decoder, the high reliability is assured with respect to chip operations and the like.

6 Claims, 15 Drawing Sheets

OTHER PUBLICATIONS

T.C. May, et al., IEEE Transactions On Electron Devices, vol. ED-26, No. 1, pp. 2-9, "Alpha-Particle-Induced Soft Errors in Dynamic Memories", Jan. 1979.

J.F. Ziegler, et al., IEEE Journal of Solid-State Circuits, vol. 33, No. 2, pp. 246-252, "Cosmic Ray Soft Error Rates of 16-MB DRAM Memory Chips", Feb. 1998.

* cited by examiner

⊕ : Exclusive OR (Ex-OR) circuit

SEMICONDUCTOR INTEGRATED CIRCUIT

CROSS-REFERENCE TO RELATED APPLICATIONS

This application is a Continuation of Ser. No. 10/726,544, filed Dec. 4, 2003 and claims the benefit of priority from the prior Japanese Patent Application No. 2003-345975, filed Oct. 3, 2003, the entire contents of which are incorporated herein by reference.

BACKGROUND OF THE INVENTION

1. Field of the Invention

The present invention relates to a fuse circuit which is used to perform basic setting of e.g., chip operations based on data semipermanently stored in a non-volatile memory element, e.g., a laser fuse, an E-(electrically) fuse, an anti-fuse, and more particularly the present invention is applied to a semiconductor integrated circuit in which data is apt to be damaged due to noises in a transfer path of the data.

2. Description of the Related Art

Conventionally, a non-volatile memory element such as a fuse element is provided in a semiconductor integrated circuit in order to store data concerning operations of internal circuits such as an operating speed or an operating voltage, redundancy data used to remedy a defective cell in a memory circuit, a chip ID, security data and others.

For example, a fuse circuit stores such data by using a fuse set consisting of a plurality of fuse elements. If an electrically programmable element such as an E-fuse, an anti-fuse or the like is used as the fuse element, such data can be stored with any timing both before and after an assembling step.

However, if an electrically programmable element such as an E-fuse or an anti-fuse is used as the fuse element in particular, all data may not be correctly programmed in a programming step in some cases. Further, data concerning an operating of internal circuits or redundancy data is transferred from the fuse circuit to an internal circuit which requires such data through a long transfer path. Therefore, data may be damaged due to noises in the transfer path in some cases.

A technique of a patent cited reference 1 (Japanese patent application laid-open No. 2002-133895) is characterized in that the reliability during reading program data is improved by storing the program data in an anti-fuse pair. That is, writing (dielectric breakdown) is executed with respect to any one of the anti-fuse pair in accordance with a value of the program data. In this case, since a difference in resistance value between the anti-fuse pair when reading the program data ("0" or "1") can be increased, the reliability of data judgment during reading can be improved.

Therefore, for example, when storing the program data by using one fuse element, irregularities in characteristics (damaged state) of the fuse element adversely affect reading. However, the technique of the patent cited reference 1 can ease such an adverse affect by storing the program data in the anti-fuse pair.

However, even if such a structure is adopted, the technique of the patent cited reference 1 cannot avoid garbled data or the like due to noises generated in the above-described transfer path, for example. An error of a data value caused to due to such garbled data naturally cannot be corrected. Furthermore, in the technique of the patent cited reference 1, since one bit of the program data is stored by using the anti-fuse pair, i.e., two fuse elements, a circuit size is increased, which becomes a factor of an increase in a chip area.

Meanwhile, a technique described in a non-patent cited reference 1 (Michael R. Ouellette, Darren L. Anand, and Peter Jakobsen, "Shared Fuse Macro for Multiple Embedded Memory Devices with Redundancy", IEEE 2001 Custom Integrated Circuits Conference) concerns a DRAM mixed integrated circuit, and is characterized in that a fuse set consisting of fuse elements as PROMs is constituted as a fuse macro and fuse data is transferred from the fuse macro to a DRAM macro by using a shift register.

In such a structure, however, when a transfer path from the fuse macro to the DRAM macro is very long, there is a risk that erroneous data may be transferred due to skew of a transfer signal or damages of data due to coupling noises. Moreover, a use of an asynchronous transfer circuit can be considered in order to reduce affects of such skew of a transfer signal or coupling noises. In such a case, however, a transfer speed of data is lowered.

Usually, data read from the fuse circuit when turning on a power supply is latched in a latch circuit. However, when there is generated a soft error due to an alpha line described in, e.g., a non-patent cited reference 2 (T. C. May and M. H. Woods, IEEE Trans. Electron Devices ED-26, 2 (1979)) or a soft error due to neutrons described in a non-patent cited reference 3 (J. F. Ziegler et al., "Cosmic Ray Soft Error Rates of 16-Mb DRAM Memory Chips", IEEE J. Solid-State Circuits, vol. 33, No. 2, February 1998) in connection with data latched in the latch circuit, there occurs a problem that unintentional trimming of operation conditions of an internal circuit or an erroneous remedy of a defective cell in a memory circuit is performed due to erroneous data.

In such a manner, when performing the basic setting of chip operations based on data semipermanently stored in a non-volatile memory element such as a fuse element, if the reliability of a non-volatile memory element itself is low or if there is a risk that the data in the non-volatile memory element is changed to erroneous data in the transfer path or the latch circuit, the prior art does not take any specific countermeasure in order to avoid such a problem.

Therefore, when the erroneous data is read from the non-volatile memory element such as a fuse element or when the erroneous data is generated in the transfer path or the latch circuit, it is desired to correctly perform the basic setting of chip operations, a remedy a defective chip, reading a chip ID or security data.

BRIEF SUMMARY OF THE INVENTION

A semiconductor integrated circuit according to an aspect of the present invention comprises a non-volatile memory element, a latch circuit which latches data read from the non-volatile memory, a control circuit which requires the data latched in the latch circuit, and a decoder which is connected to a transfer path extending from the non-volatile memory to the control circuit and decodes the data.

A semiconductor integrated circuit according to an aspect of the present invention comprises a non-volatile memory element, a latch circuit which latches data read from the non-volatile memory element, a control circuit which requires data latched in the latch circuit, an encoder which is connected to a transfer path of data from the non-volatile memory element to the control circuit and encodes data, and a decoder which is connected to the transfer path and decodes the data encoded by the encoder.

DETAILED DESCRIPTION OF THE INVENTION

A semiconductor integrated circuit of an aspect of the present invention will be described below in detail with reference to the accompanying drawings.

1. Outline

It is presumed that a semiconductor integrated circuit according to an aspect of the present invention has a circuit which semipermanently stores data (option data) concerning operations of internal circuits such as an operating speed or an operating voltage, redundancy data used to remedy a defective cell in a memory circuit, a chip ID, security data or the like in a non-volatile manner.

For example, since a fuse circuit having a fuse set consisting of a plurality of fuse elements is general as such a circuit, a description will be given as to a semiconductor integrated circuit having a fuse circuit as an example.

Data read from the fuse circuit is transferred to an internal circuit which requires the data through a long transfer path. Here, in the transfer path, there is a risk that erroneous data may be generated due to skew of a transfer signal or coupling noises. Further, data read from the fuse circuit is latched in a latch circuit, but a soft error due to an alpha line or neutrons may be generated in the latch circuit in some cases.

Thus, in the semiconductor integrated circuit concerning the examples according to the present invention, a decoder, or both an encoder and a decoder used to suppress generation of erroneous data are connected to the transfer path from the fuse circuit to an internal circuit requiring fuse data (e.g., an option setting circuit which determines operation characteristics of any other internal circuit). Furthermore, an error correction circuit used to correct erroneous data is connected to the transfer path.

With such a structure, it is possible to correctly perform basic setting of chip operations, a remedy of a defective cell, reading of a chip ID and security data and others under any circumstances.

2. Embodiments (1) Entire Structure

Figure 1:
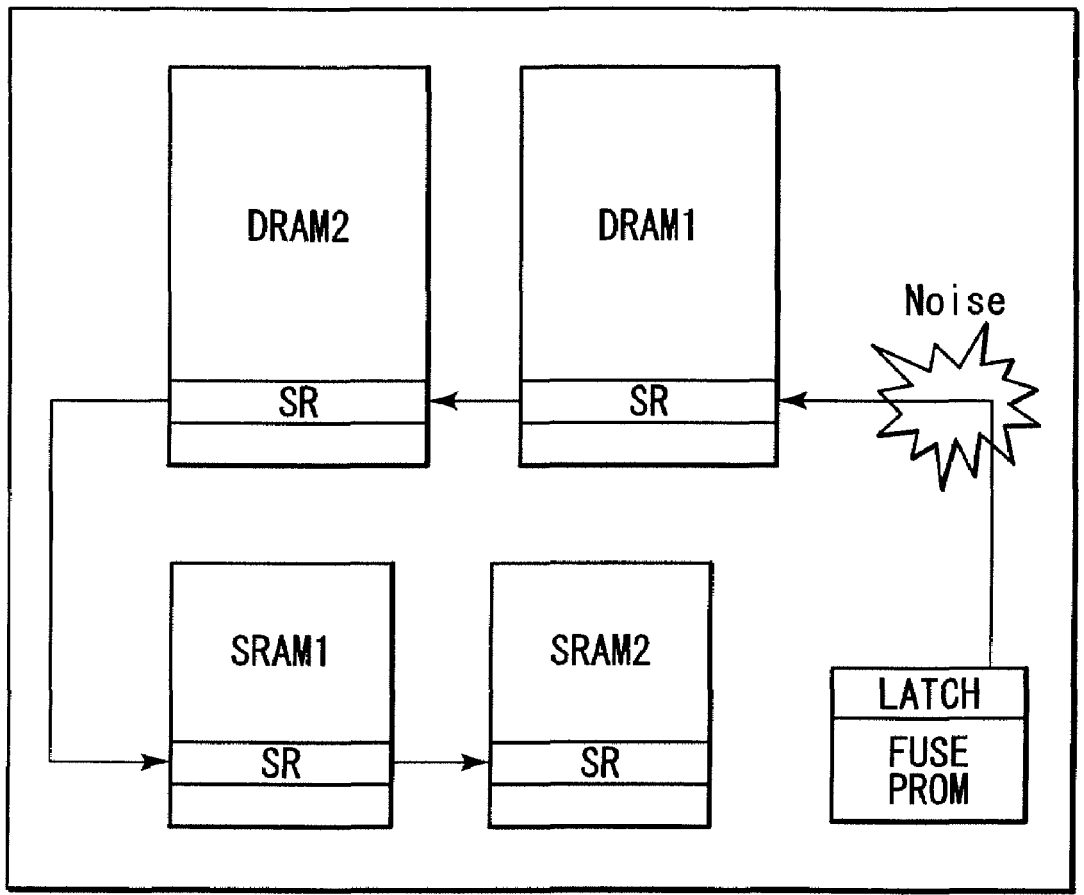
FIG. 1 is a view showing an example of a transfer path of fuse data.

FIG. 1 shows an example of a semiconductor integrated circuit in which both a DRAM and an SRAM are mounted.

The circuit shown in FIG. 1 is a general memory mixed LSI such as disclosed in the non-patent cited reference 1, and has a fuse data transfer circuit using a shift register.

In a chip 10 are arranged, e.g., four memory blocks (DRAM1, DRAM2, SRAM1, SRAM2) and a fuse block (FUSE PROM). Each of the memory blocks (DRAM1, DRAM2, SRAM1, SRAM2) has a shift register SR. Data read from the fuse block (FUSE PROM) is transferred to the shift register SR in each of the memory blocks (DRAM1, DRAM2, SRAM1, SRAM2).

Here, in a transfer path using such a shift register SR, there is a risk that erroneous data may be generated due to skew of a transfer signal, coupling noises and others.

(2) Fuse Circuit

Figure 2:
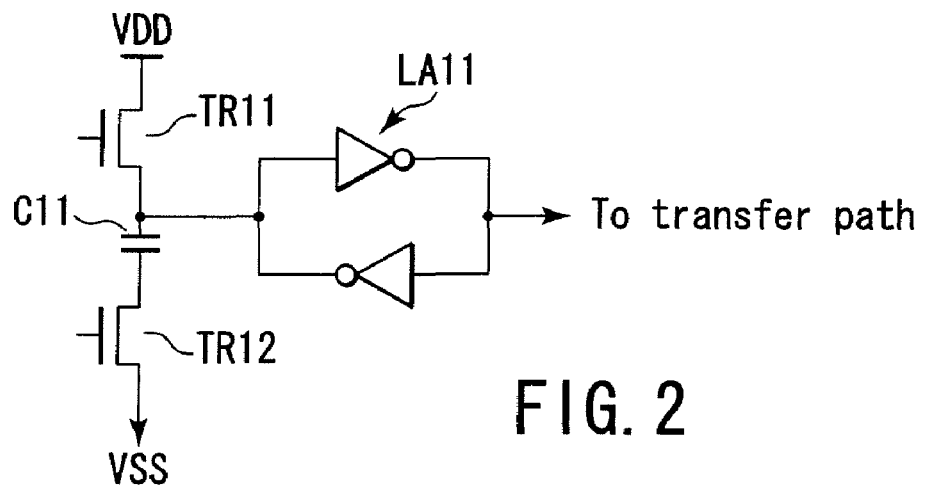
FIG. 2 is a view showing an example of a fuse circuit.
Figure 3:
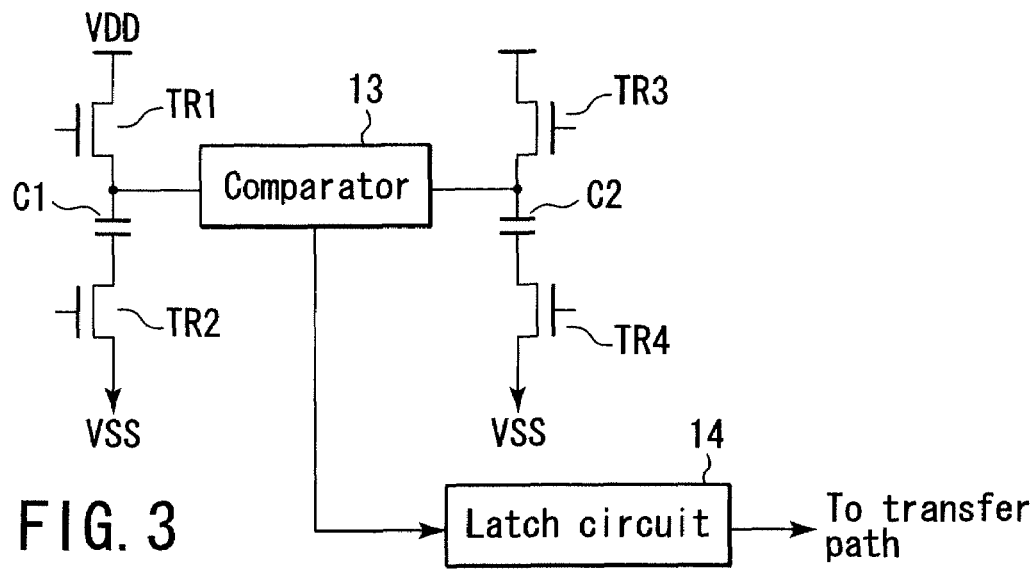
FIG. 3 is a view showing an example of a fuse circuit.

FIGS. 2 and 3 show a part of the fuse block (FUSE PROM) depicted in FIG. 1.

In the example of FIG. 2, N channel MOS transistors TR11 and TR12 and an anti-fuse element C11 are connected in series between a power supply terminal VDD and a ground terminal VSS. The anti-fuse element C11 is connected between the MOS transistors TR11 and TR12. The anti-fuse element C11 is of a type which stores program data by utilizing, e.g., a dielectric breakdown of a capacitor. A latch circuit LA11 is connected to one end of the anti-fuse element C11. In this example, the latch circuit LA11 is constituted of a flip-flop-connected inverter.

In the example of FIG. 3, N channel MOS transistors TR1 and TR2 and an anti-fuse element C1 are connected in series between the power supply terminal VDD and the ground terminal VSS. The anti-fuse element C1 is connected between the MOS transistors TR1 and TR2. Furthermore, N channel MOS transistors TR3 and TR4 and an anti-fuse element C2 are connected in series between the power supply terminal VDD and the ground terminal VSS. The anti-fuse element C2 is connected between the MOS transistors TR3 and TR4.

The anti-fuse elements C1 and C2 are of a type which stores program data by utilizing, e.g., a dielectric breakdown of a capacitor. Writing (dielectric breakdown) is executed with respect to any one of the anti-fuse elements C1 and C2 in accordance with a value of the program data ("0" or "1"). In this case, since a difference in resistance value between the anti-fuse elements C1 and C2 when reading the program data can be increased, the reliability of data judgment using a comparator 13 during reading can be improved. A latch circuit 14 latches data outputted from the comparator 13.

(3) Simplification

Figure 4:
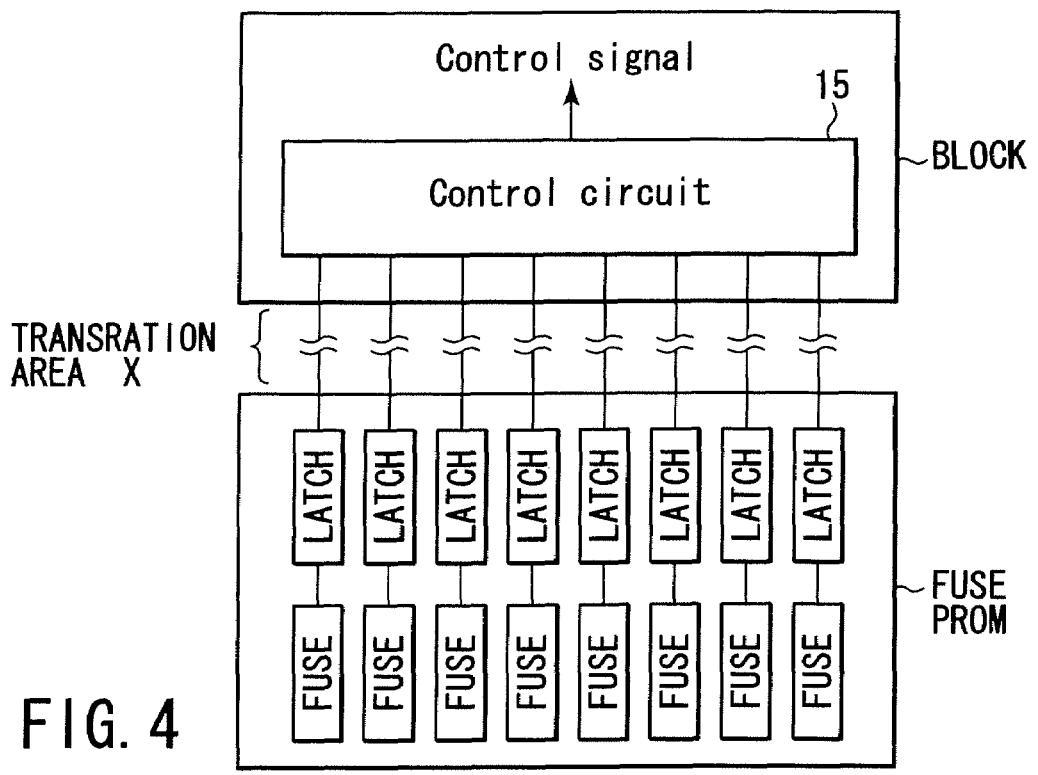
FIG. 4 is a view showing an example of a transfer path of fuse data.

FIG. 4 shows a transfer path of fuse data.

Here, although, e.g., the transfer path using the shift register depicted in FIG. 1 can be applied as it is, the shift register is not used for simplification.

One set of fuse elements FUSE (one fuse set) in the fuse block FUSE PROM, which is eight fuse elements FUSE in this example, stores, e.g., data used to perform basic setting of chip operations or a remedy of a defective cell, a chip ID, security data and others.

Fuse data read from the eight fuse elements FUSE is latched in latch circuits, and then transferred to transfer paths (TRANSRATION AREA X). The latch data is inputted to a control circuit 15 in a function block BLOCK through the transfer paths (TRANSRATION AREA X). In this example, eight latch circuits LATCH are provided in accordance with one set of the fuse elements FUSE.

It is to be noted that the function block BLOCK may correspond to one of the memory blocks (DRAM1, DRAM2, SRAM1, SRAM2) shown in FIG. 1, or it may be a redundancy control block corresponding to some option setting circuits existing in the memory blocks or divided memory cell arrays.

For example, when a power supply is turned on, the fuse data is read from the eight fuse elements FUSE, latched in the latch circuits LATCH, and then transferred to the transfer paths (TRANSRATION AREA X). The control circuit 15 executes, e.g., the basic settings of chip operations and others based on the fuse data latched in the latch circuits LATCH.

(4) First Embodiment

A semiconductor integrated circuit concerning a first embodiment will now be described hereinafter.

Figure 5:
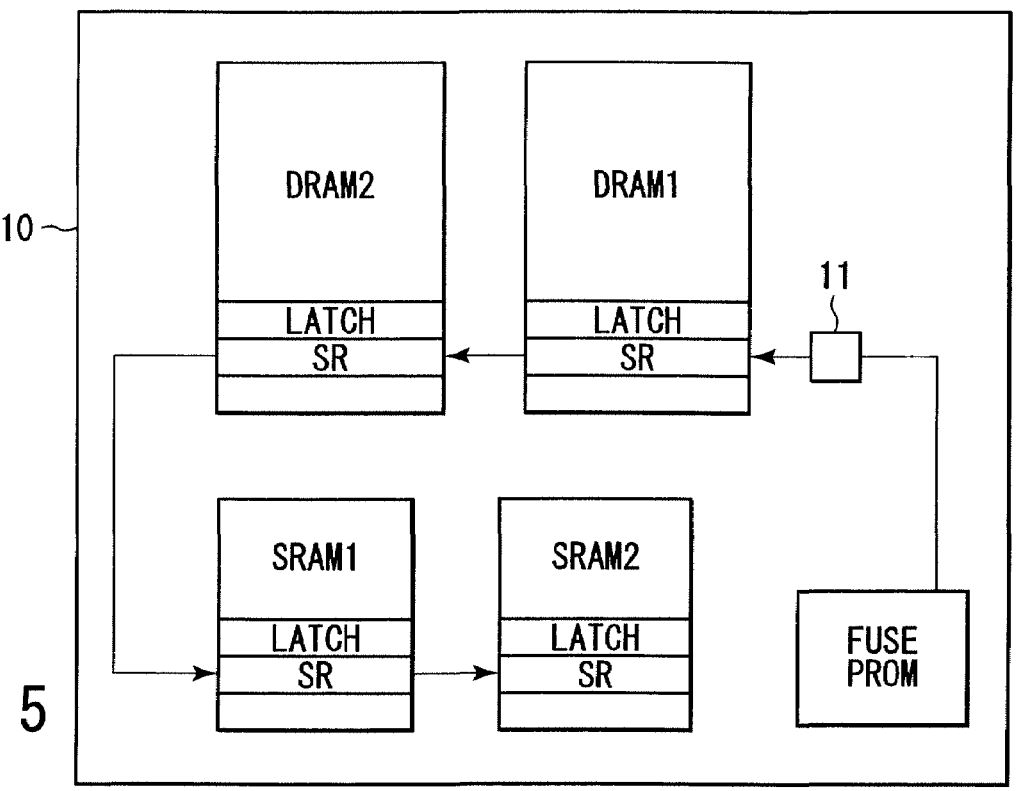
FIG. 5 is a view showing a semiconductor integrated circuit concerning a first embodiment.

FIG. 5 shows a semiconductor integrated circuit concerning the first embodiment.

This semiconductor integrated circuit relates to a memory mixed LSI (mixed memory) in which both a DRAM and an SRAM are mounted.

In a chip 10 are arranged, e.g., four memory blocks (DRAM1, DRAM2, SRAM1, SRAM2) and a fuse block (FUSE PROM). Each of the memory blocks (DRAM1, DRAM2, SRAM1, SRAM2) has a shift register SR.

Data read from the fuse block (FUSE BLOCK) is transferred to a shift register SR in each of the memory blocks (DRAM1, DRAM2, SRAM1, SRAM2). Here, in a transfer path using such a shift register SR, there is a risk that erroneous data may be generated due to skew of a transfer signal or coupling noises.

Thus, in the first embodiment, encoded data is programmed in fuse elements in the fuse circuit FUSE PROM.

Moreover, a decoder 11 used to detect and correct an error in the data is connected at a last part of the transfer path extending from an output end of the fuse block (FUSE BLOCK) at which the noise is considered to be most likely to be generated to an input end of the memory block (DRAM1) to which the fuse data is first inputted.

In this manner, the encoded data is programmed in the fuse elements in the fuse circuit FUSE PROM, and the decoder 11 used to detect and correct an error in data is arranged at an inlet part of the memory block (DRAM1) to which the fuse data is first inputted. As a result, since the data read from the fuse circuit FUSE PROM is the encoded data, passing this data through the long transfer path enables easy detection and correction of the erroneous data even if the erroneous data is generated.

It is to be noted that the encoded data is decoded by the decoder 11 immediately before being inputted to the shift register SR, and hence the decoded regular fuse data is inputted to the shift register. Thereafter, the fuse data is latched in the latch circuit LATCH.

With the above-described structure, the basic setting of chip operations, a remedy of a defective cell, reading of a chip ID and security data and others are correctly performed based on the fuse data read from the fuse circuit FUSE PROM.

Figure 6:
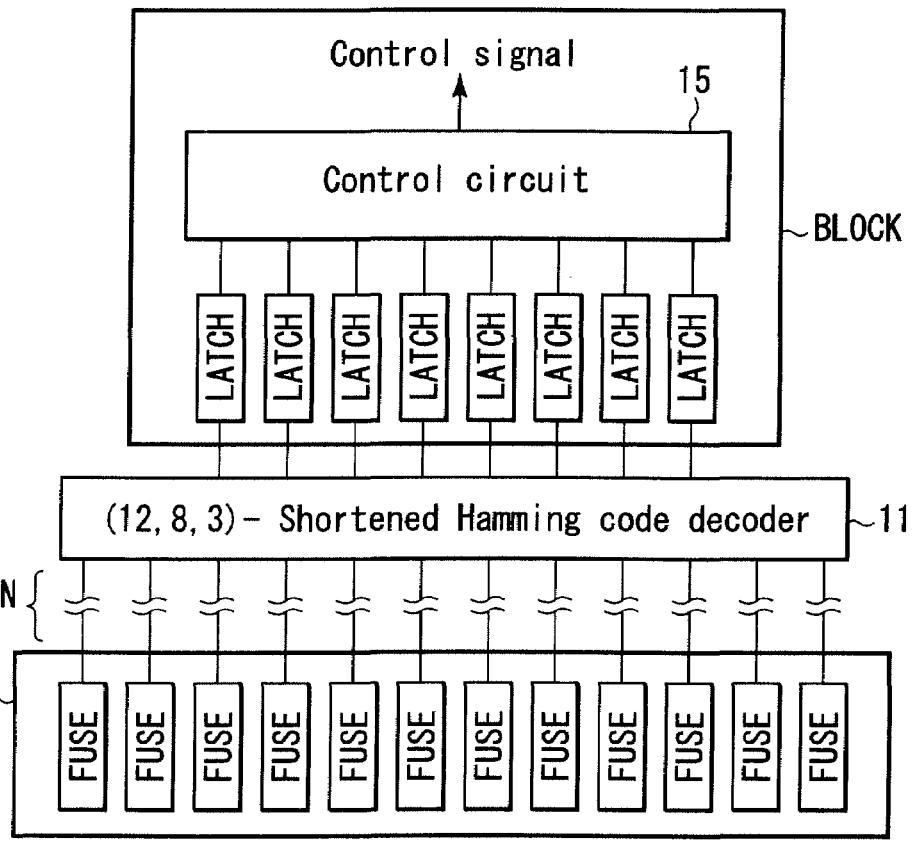
FIG. 6 is a view showing the semiconductor integrated circuit concerning the first embodiment.

FIG. 6 shows transfer paths of the fuse data.

Here, for example, the serial transfer path using the shift register shown in FIG. 5 can be applied as it is, but a description will be given as to parallel transfer without using the shift register for convenience's sake.

One set of fuse elements FUSE (one fuse set) in the fuse block FUSE PROM, which is 12 fuse elements FUSE in this example, stores, e.g., data for the basic setting of chip operations or a remedy of a defective cell, a chip ID, security data and others.

In this example, program data consisting of eight bits is encoded by using, e.g., Hamming Code (which is accurately a shortened Hamming code), and it is written as a code word consisting of 12 bits into the 12 fuse elements.

Therefore, for example, when the power supply is turned on, data read from the fuse elements FUSE is encoded data consisting of 12 bits, and the encoded data is inputted to the decoder 11 through transfer paths (TRANSRATION AREA X).

In the decoder 11, the data consisting of 12 bits is decoded to data consisting of eight bits. Then, the decoded eight-bit data is latched in latch circuits LATCH in a function block BLOCK. In this example, eight latch circuits LATCH are provided in accordance with the decoded eight-bit data.

It is to be noted that the function block BLOCK may correspond to one of the memory blocks (DRAM1, DRAM2, SRAM1, SRAM2) shown in FIG. 5, or it may be a redundancy control block corresponding to some option setting circuits existing in the memory blocks or divided memory cell arrays.

The control circuit 15 executes, e.g., the basic setting of chip operations or the like based on the fuse data latched in the latch circuit LATCH.

In this manner, in the first embodiment, the encoded data is programmed in the fuse elements FUSE, and the data read from the fuse elements FUSE is decoded by the decoder 11 immediately before being latched by the latch circuits LATCH through the long transfer paths.

Therefore, if the reliability of the fuse elements FUSE is low and some of the fuse elements FUSE do no hold correct data, and if the data read from the fuse elements FUSE is changed to erroneous data due to any affect during transfer, detection and correction of an error can be performed by using, e.g., an error correction code in the decoder 11.

(5) Second Embodiment

A semiconductor integrated circuit concerning a second embodiment will now be described hereinafter.

Figure 7:
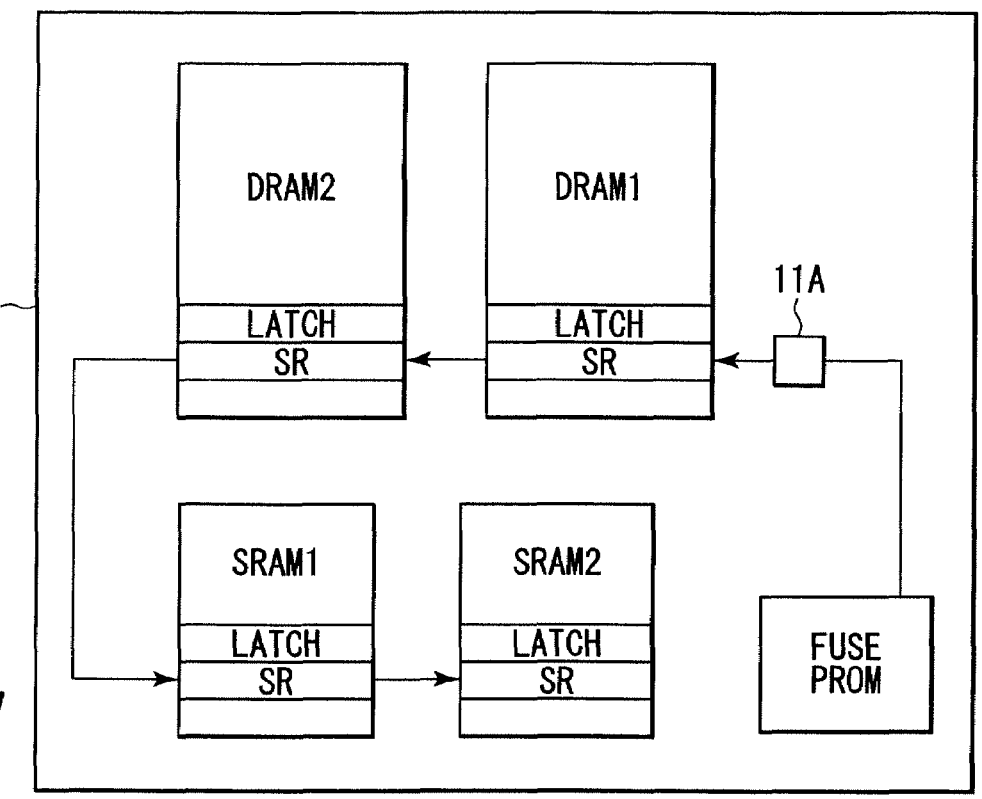
FIG. 7 is a view showing a semiconductor integrated circuit concerning a second embodiment.

FIG. 7 shows a semiconductor integrated circuit concerning the second embodiment.

This semiconductor integrated circuit is characterized in that a decoder/error correction circuit 11A is provided in place of the decoder 11 as compared with the semiconductor integrated circuit concerning the first embodiment (see FIG. 5).

Since any other structure is the same as that of the first embodiment mentioned above, its explanation will be eliminated here.

Figure 8:
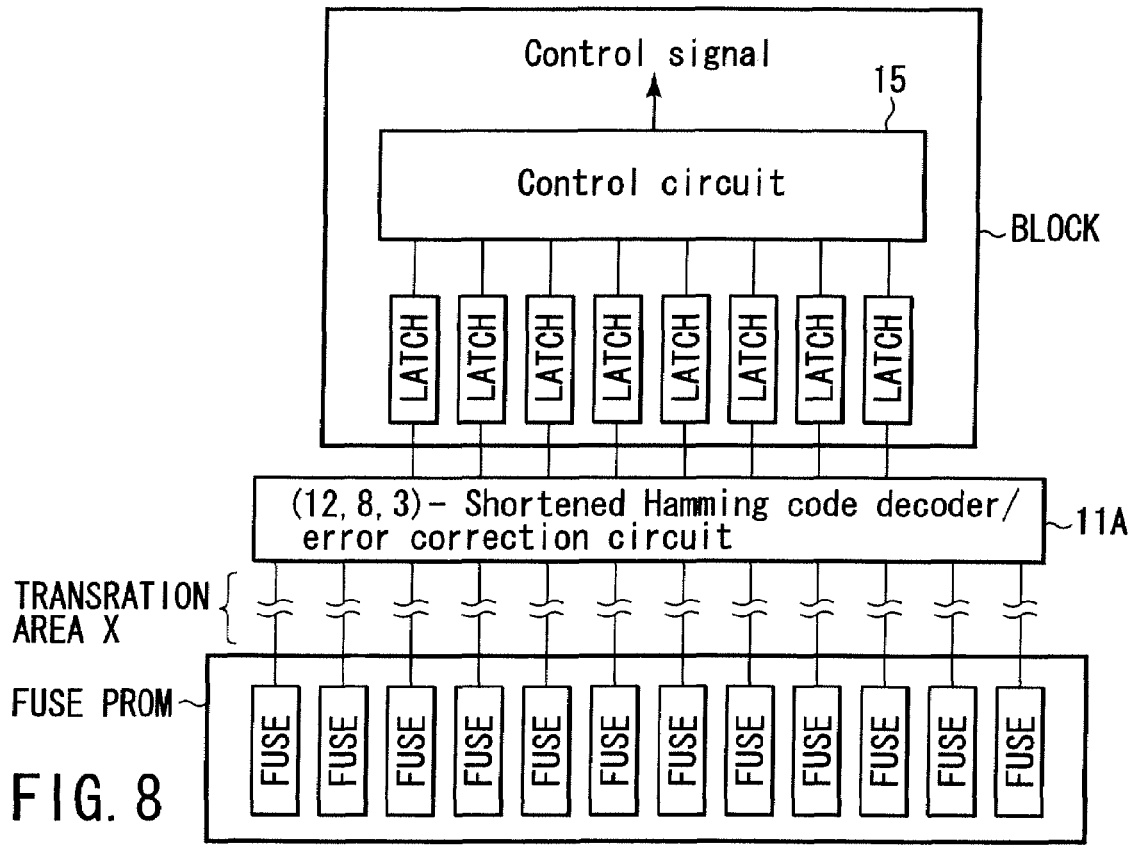
FIG. 8 is a view showing the semiconductor integrated circuit concerning the second embodiment.

FIG. 8 shows transfer paths of fuse data.

One set of fuse elements FUSE in the fuse block FUSE PROM, which is 12 fuse elements FUSE in this example, stores, e.g., data for the basic setting of chip operations or a remedy of a defective cell, a chip ID, security data and others.

In this example, program data consisting of eight bits is encoded by using, e.g., Hamming Code (which is accurately a shortened Hamming code), and it is written as a code word consisting of 12 bits into 12 fuse elements FUSE.

Therefore, for example, when a power supply is turned on, data read from the fuse elements FUSE is encoded 12-bit data, and this encoded data is inputted to a decoder/error correction circuit 11A through transfer paths (TRANSRATION AREA X).

The decoder/error correction circuit 11A decodes the 12-bit data into 8-bit data, and detects and corrects, e.g., an n-bit error (n is a natural number) when the n-bit error exists. Then, the decoded and corrected 8-bit data is latched by latch circuits LATCH in the function block BLOCK. In this example, eight latch circuits LATCH are provided in accordance with the decoded 8-bit data.

It is to be noted that the function block BLOCK may correspond to, e.g., one of the memory blocks (DRAM1, DRAM2, SRAM1, SRAM2) shown in FIG. 7, or it may be a redundancy control block corresponding to some option setting circuits existing in the memory blocks or divided memory cell arrays.

A control circuit 15 executes the basic setting of chip operations and others based on the fuse data latched by the latch circuits LATCH.

In this manner, in the second embodiment, the encoded data is programmed in the fuse elements FUSE, and the data read from the fuse elements FUSE is decoded by the decoder/error correction circuit 11A through the long transfer path immediately before being latched by the latch circuits LATCH.

Therefore, if the reliability of the fuse elements FUSE is low and some of the fuse elements FUSE do not hold correct data, and if the data read from the fuse elements FUSE is changed into erroneous data due to any affect during transfer, the correct data can be latched by utilizing the error correction function of the decoder/error correction circuit 11A.

It is to be noted that only the error detection may be performed when the number of erroneous bits exceeds the number of bits which can be corrected by the decoder/error correction circuit 11A.

(6) Third Embodiment

A semiconductor integrated circuit concerning a third embodiment will now be described hereinafter.

Figure 9:
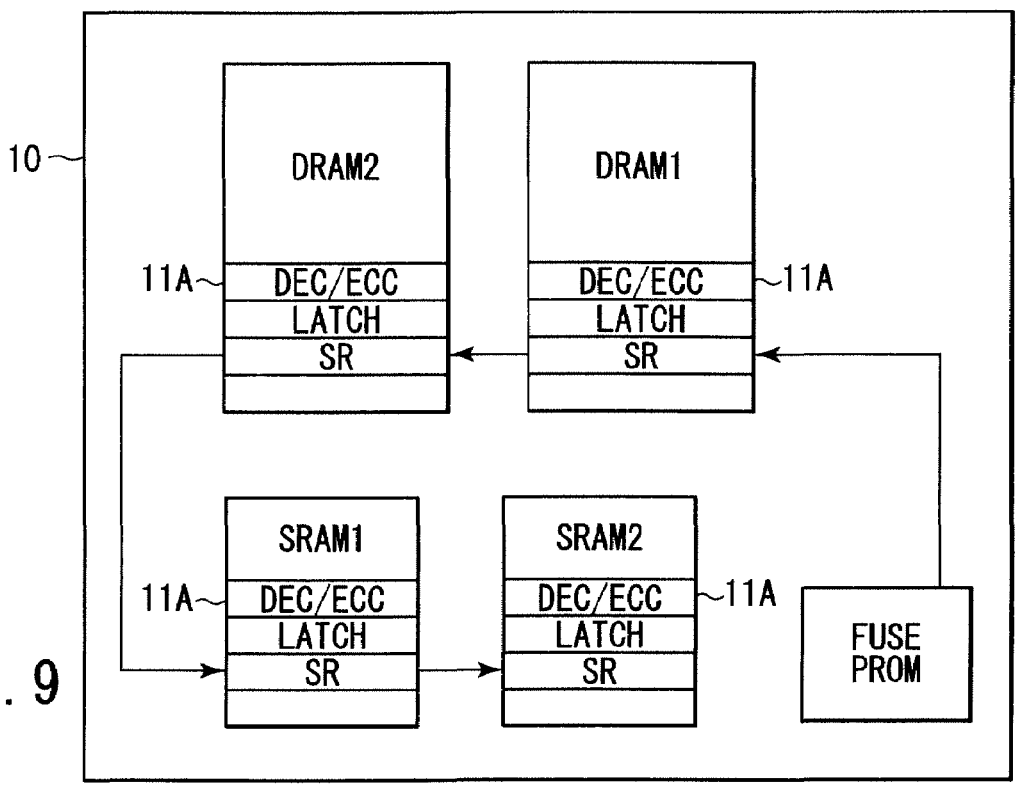
FIG. 9 is a view showing a semiconductor integrated circuit concerning a third embodiment.

FIG. 9 shows a semiconductor integrated circuit concerning the third embodiment.

This semiconductor integrated circuit is characterized in a position of a decoder/error correction circuit (DEC/ECC) 11A as compared with the semiconductor integrated circuit concerning the second embodiment (see FIG. 7).

That is, although only the one decoder/error correction circuit 11A is provided in common with all the memory blocks (DRAM1, DRAM2, SRAM1, SRAM2) in the example of FIG. 7, a decoder/error correction circuit 11A is provided to each of the memory blocks (DRAM1, DRAM2, SRAM1, SRAM2) in this example.

In this case, error detection or error correction can be performed with respect to, e.g., a soft error due to an alpha line or neutrons generated in latch circuits LATCH in the respective memory blocks (DRAM1, DRAM2, SRAM1, SRAM2).

As described above, in this example, even if there is a problem in the reliability of the latch circuits, i.e., even if is a possibility that a soft error can be generated due to an alpha line or neutrons (SEU: single event upset), error detection/correction is possible by the decoder/error correction circuit in each function block, thereby improving the reliability of the entire chip.

It is to be noted that any other structure is the same as that in the first embodiment mentioned above, thereby eliminating its explanation.

Figure 10:
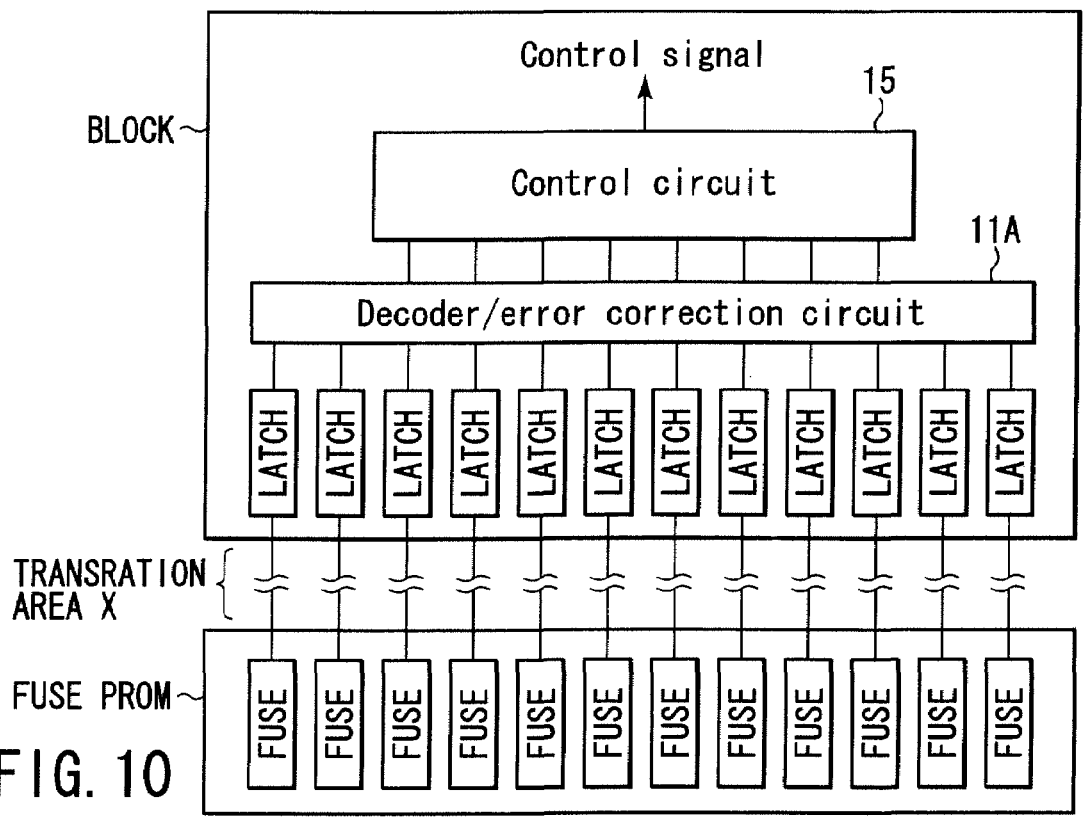
FIG. 10 is a view showing the semiconductor integrated circuit concerning the third embodiment.

FIG. 10 shows transfer paths of fuse data.

One set of fuse elements FUSE in a fuse block FUSE PROM, which is 12 fuse elements FUSE in this example, stores, e.g., data for the basic setting of chip operations or a remedy of a defective cell, a chip ID, security data and others.

In this example, program data consisting of eight bits is encoded by using, e.g., Hamming Code (which is accurately a shortened Hamming code), and it is written as a code word consisting of 12 bits into the 12 fuse elements FUSE.

Therefore, for example, when a power supply is turned on, data read from the fuse elements FUSE is encoded data consisting of 12 bits, and the encoded data is latched by latch circuits LATCH in a function block BLOCK through transfer paths (TRANSRATION AREA X).

In this example, 12 latch circuits LATCH are provided in accordance with the encoded 12-bit data read from the fuse elements FUSE. Further, although the fuse data is transferred in parallel in FIG. 10, it can be likewise applied to serial transfer.

Data in the latch circuits LATCH is inputted to a control circuit 15 through the decoder/error correction circuit 11A. The control circuit 15 executes the basic setting of chip operations and others based on output data from the decoder/error correction circuit 11A.

Here, the decoder/error correction circuit 11A decodes the 12-bit data into the 8-bit data, and detects and corrects, e.g., an n-bit error (n is a natural number) when the n-bit error exists. Then, the decoded and corrected 8-bit data is supplied to the control circuit 15 as output data.

It is to be noted that the function block BLOCK may correspond to, e.g., one of the memory blocks (DRAM1, DRAM2, SRAM1, SRAM2) shown in FIG. 9, or it may be a redundancy control block corresponding to some option setting circuits existing in the memory blocks or divided memory cell arrays.

As described above, in the third embodiment, the encoded data is programmed in the fuse elements FUSE, and the data read from the fuse elements FUSE is latched by latch circuits LATCH through the long transfer paths. Thereafter, the data is decoded by the decoder/error correction circuit 11A and supplied to the control circuit 15.

Therefore, if the reliability of the fuse elements FUSE is low and some of the fuse elements FUSE do no hold correct data, if the data read from the fuse elements FUSE is changed into erroneous data due to any affect during transfer, and if a soft error is generated in the latch circuits, the correct data can be transferred to the control circuit 15 by utilizing the error correction function of the decoder/error correction circuit 11A provided in each block.

It is to be noted that only the error detection may be executed when the number of erroneous bits exceeds the number of bits which can be corrected by the decoder/error correction circuit 11A. Furthermore, the decoder/error correction circuit 11A may be substituted by the decoder 11.

(7) Fourth Embodiment

A semiconductor integrated circuit concerning a fourth embodiment will now be described hereinafter.

Figure 11:
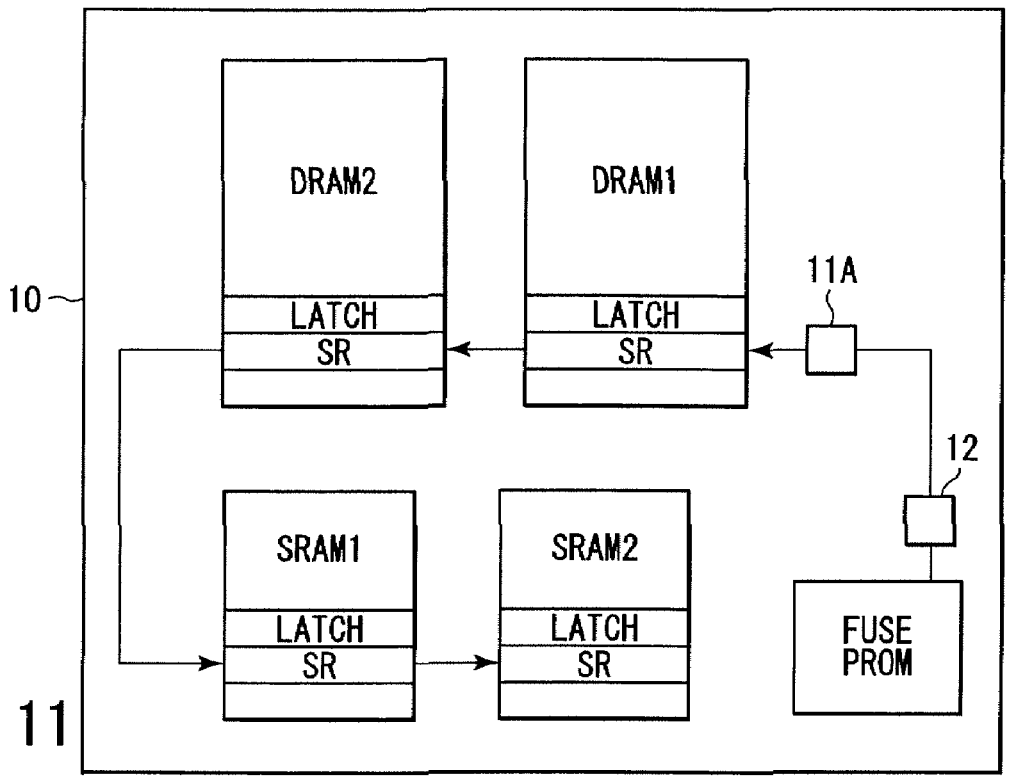
FIG. 11 is a view showing a semiconductor integrated circuit concerning a fourth embodiment.

FIG. 11 shows a semiconductor integrated circuit concerning the fourth embodiment.

The fourth embodiment is obtained by modifying the second embodiment and characterized in that an encoder 12 is newly provided.

In a chip 10 are arranged, e.g., four memory blocks (DRAM1, DRAM2, SRAM1, SRAM2) and a fuse block (FUSE PROM). Each of the memory blocks (DRAM1, DRAM2, SRAM1, SRAM2) has a shift register SR.

Data read from the fuse block (FUSE PROM) is transferred to the shift register SR in each of the memory blocks (DRAM1, DRAM2, SRAM1, SRAM2). Here, in a transfer path using such a shift register SR, there is a risk that erroneous data may be generated due to skew of a transfer signal or coupling noises.

Thus, in the fourth embodiment, a decoder/error correction circuit 11A used to detect and correct a data error and an encoder 12 are connected to a transfer path extending from an output end of the fuse block (FUSE PROM) at which the noise is considered to be most likely to be produced to an input end of the memory block (DRAM1) to which fuse data is first inputted.

Specifically, the decoder/error correction circuit 11A used to detect and correct a data error is arranged at an inlet part of the memory block (DRAM1) to which the fuse data is first inputted. Moreover, the encoder 12 is arranged at the output end of the fuse block (FUSE PROM). As a result, the data read from the fuse circuit FUSE PROM is encoded, then transferred to the transfer path, and decoded immediately before being inputted to the shift register SR. Therefore, even if erroneous data is generated, it can be readily detected and corrected.

With the above-described structure, the basic setting of chip operations, a remedy of a defective cell, reading of a chip ID and security data and others are correctly performed based on the fuse data read from the fuse circuit FUSE PROM.

It is to be noted that the decoder/error correction circuit 11A may be substituted by, e.g., the decoder 11 as shown in FIG. 5. In this case, the fourth embodiment is a modification of the first embodiment.

Figure 12:
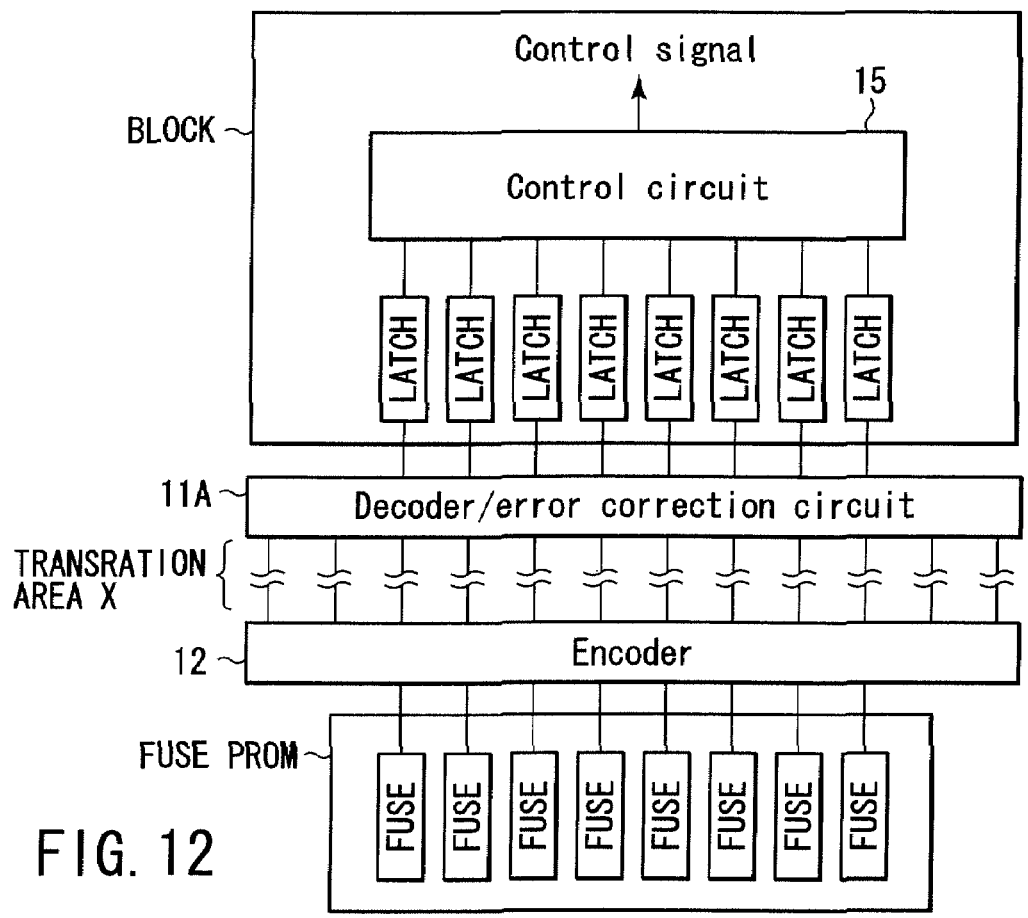
FIG. 12 is a view showing the semiconductor integrated circuit concerning the fourth embodiment.

FIG. 12 shows transfer paths of the fuse data.

One set of fuse elements FUSE in the fuse block FUSE PROM, which is eight fuse elements FUSE in this embodiment, stores, e.g., data for the basic setting of chip operations or a remedy of a defective cell, a chip ID, security data and others.

In this example, since the encoder 12 is connected to output ends of the fuse circuit FUSE PROM, the eight-bit program data read from the fuse elements FUSE is encoded by using, e.g., a Hamming Code (which is accurately a shortened Hamming code), and it is transferred as a code word consisting of 12 bits to transfer paths (TRANSRATION AREA X).

Therefore, for example, when a power supply is turned on, the data read from the fuse elements FUSE becomes the encoded 12-bit data and is inputted to the decoder/error correction circuit 11A through the transfer paths (TRANSRATION AREA X).

The decoder/error correction circuit 11A decodes the 12-bit data into the 8-bit data, and detects and corrects, e.g., an n-bit error (n is a natural number) when the n-bit error exists. Then, the decoded and corrected 8-bit data is latched by the latch circuits LATCH in the function block BLOCK. In this example, eight latch circuits LATCH are provided in accordance with the decoded 8-bit data.

It is to be noted that the function block BLOCK may correspond to, e.g., one of the memory blocks (DRAM1, DRAM2, SRAM1, SRAM2) shown in FIG. 11, or it may be a redundancy control block corresponding to some option setting circuits existing in the memory blocks or divided memory cell arrays.

A control circuit 15 executes, e.g., the basic setting of chip operations and others based on the fuse data latched by the latch circuits LATCH.

As described above, in the fourth embodiment, the data read from the fuse elements FUSE is encoded by the encoder 12, then transferred to the transfer paths, and decoded by decoder/error correction circuit 11A immediately before being latched by the latch circuits LATCH in the function block BLOCK.

Therefore, if the reliability of the fuse elements FUSE is low and some of the fuse elements FUSE do not hold correct data, and if the data read from the fuse elements FUSE is changed into erroneous data due to any affect during transfer, error detection/correction or the like can be performed by using an error correction code in the decoder/error correction circuit 11A.

(8) Fifth Embodiment

A semiconductor integrated circuit concerning a fifth embodiment will now be described.

Figure 13:
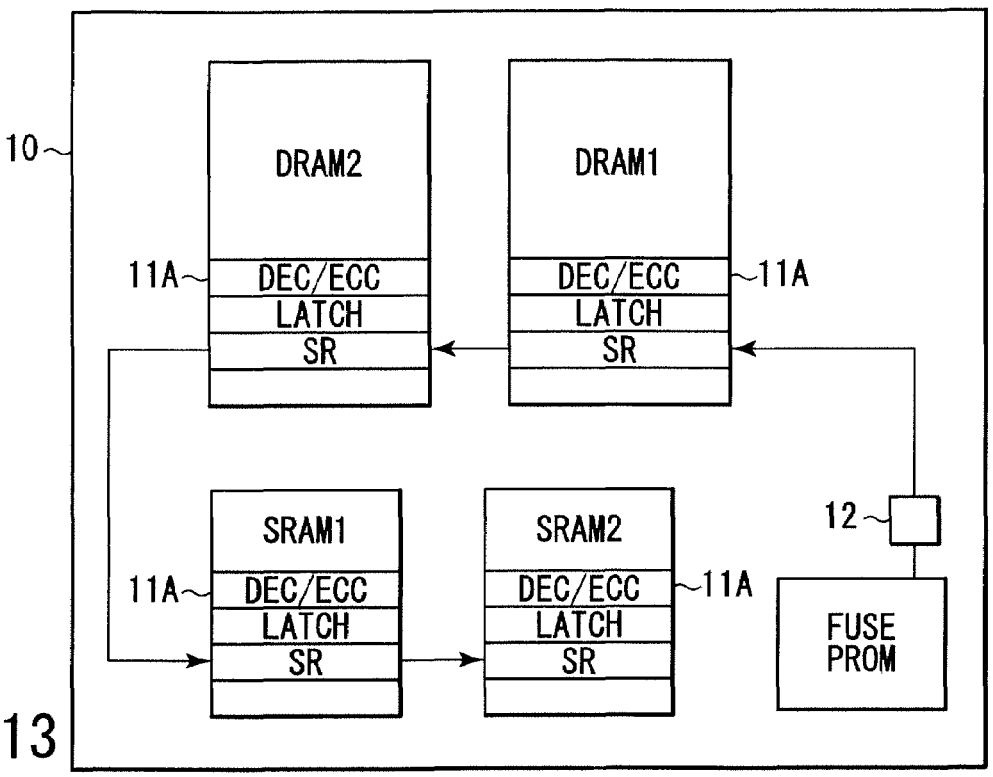
FIG. 13 is a view showing a semiconductor integrated circuit concerning a fifth embodiment.

FIG. 13 shows a semiconductor integrated circuit concerning the fifth embodiment. The fifth embodiment is obtained by further modifying the third embodiment, and characterized in that an encoder 12 is newly provided.

In a chip 10 are arranged, e.g., four memory blocks (DRAM1, DRAM2, SRAM1, SRAM2) and a fuse block (FUSE PROM). Each of the memory blocks (DRAM1, DRAM2, SRAM1, SRAM2) has a shift register SR.

Data read from the fuse block (FUSE PROM) is transferred to the shift register SR in each of the memory blocks (DRAM1, DRAM2, SRAM1, SRAM2). Here, in a transfer path using such a shift register SR, there is a risk that erroneous data may be generated due to skew of a transfer signal or coupling noises.

Thus, in the fifth embodiment, an encoder 12 is connected to an output end of the fuse block (FUSE PROM), and a decoder/error correction circuit 11A used to detect and correct a data error is arranged in each of the memory blocks (DRAM1, DRAM2, SRAM1, SRAM2). In this case, since encoded data is inputted to each shift register SR through the transfer path, erroneous data can be readily detected and corrected by the decoder/error correction circuits 11A even if the erroneous data is generated.

With the above-described structure, it is possible to correctly perform the basic setting of chip operations, a remedy of a defective cell, reading of a chip ID and security data and others based on the fuse data read from the fuse circuit FUSE PROM.

It is to be noted that the decoder/error correction circuit 11A may be substituted by the decoder 11.

In the fifth embodiment, although the 8-bit data is stored in the fuse elements FUSE, the encoded 12-bit data is latched in the latch circuits LATCH. Therefore, the semiconductor integrated circuit concerning the fifth embodiment is effective for a case that the reliability of the fuse elements FUSE is sufficiently high but there is a problem in the reliability of the latch circuits LATCH.

Figure 14:
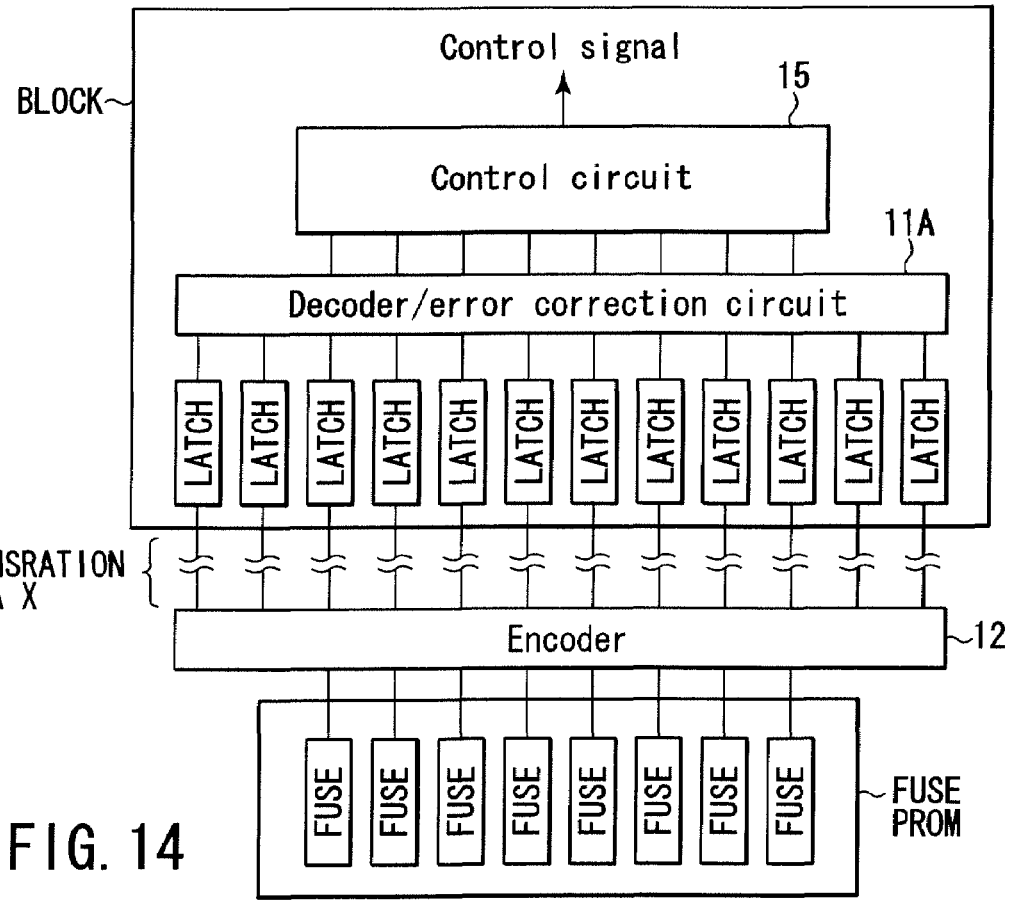
FIG. 14 is a view showing the semiconductor integrated circuit concerning the fifth embodiment.

FIG. 14 shows the transfer paths of the fuse data.

One set of fuse elements FUSE in the fuse block FUSE PROM, which is eight fuse elements FUSE in this example, stores, e.g., data for the basic setting of chip operations, a remedy of a defective cell, a chip ID, security data and others.

In this example, since the encoder 12 is connected to output ends of the fuse circuit FUSE PROM, program data consisting of eight bits read from the fuse elements FUSE is encoded by using, e.g., a Hamming Code (which is accurately a shortened Hamming code), and transferred as a code word consisting of 12 bits to transfer paths (TRANSRATION AREA X).

Therefore, for example, when a power supply is turned on, data read from the fuse elements FUSE becomes encoded data consisting of 12 bits, and is latched by latch circuits LATCH in the function block BLOCK through the transfer paths (TRANSRATION AREA X). In this example, 12 latch circuit LATCH are provided in accordance with the encoded 12-bit data read from the fuse elements FUSE.

Data of the latch circuits LATCH is inputted to a control circuit 15 through a decoder/error correction circuit 11A. The control circuit 15 executes the basic setting of chip operations and others based on output data from the decoder/error correction circuit 11A.

Here, the decoder/error correction circuit 11A decodes the 12-bit data into the 8-bit data, and can correct a one-bit error when such an error exists. Generally, a code length becomes long when using a code capable of multi error correction such as a BCH code which is well known in a code logic as well as the Hamming code used in this example. However, when, e.g., an n-bit error (n is a natural number) exists, the n-bit error is detected and corrected. Then, the decoded and corrected 8-bit data is supplied to the control circuit 15 as output data.

It is to be noted that the function block BLOCK may correspond to, e.g., one of the memory blocks (DRAM1, DRAM2, SRAM1, SRAM2) shown in FIG. 13, or it may be a redundancy control block corresponding to some option setting circuits existing in the memory blocks or divided memory cell arrays.

As described above, in the fifth embodiment, the data read from the fuse elements FUSE is encoded by the encoder 12, then transferred to the transfer path, latched by the latch circuits LATCH in the function block, and thereafter decoded by the decoder/error correction circuit 11A before the control circuit 12.

Therefore, if the reliability of the fuse elements FUSE is low and some of the fuse elements FUSE do not hold correct data, if the data read from the fuse elements FUSE is changed into erroneous data due to any affect during transfer, and if a soft error is generated in the latch circuits, the correct data can be transferred to the control circuit 15 by utilizing the error correction function of the decoder/error correction circuit 11A provided for each block.

It is to be noted that only the error detection may be executed when the number of erroneous bits exceeds the number of bits which can be corrected by the decoder/error correction circuit 11A.

(9) Sixth Embodiment

A semiconductor integrated circuit concerning a sixth embodiment will now be described.

Figure 15:
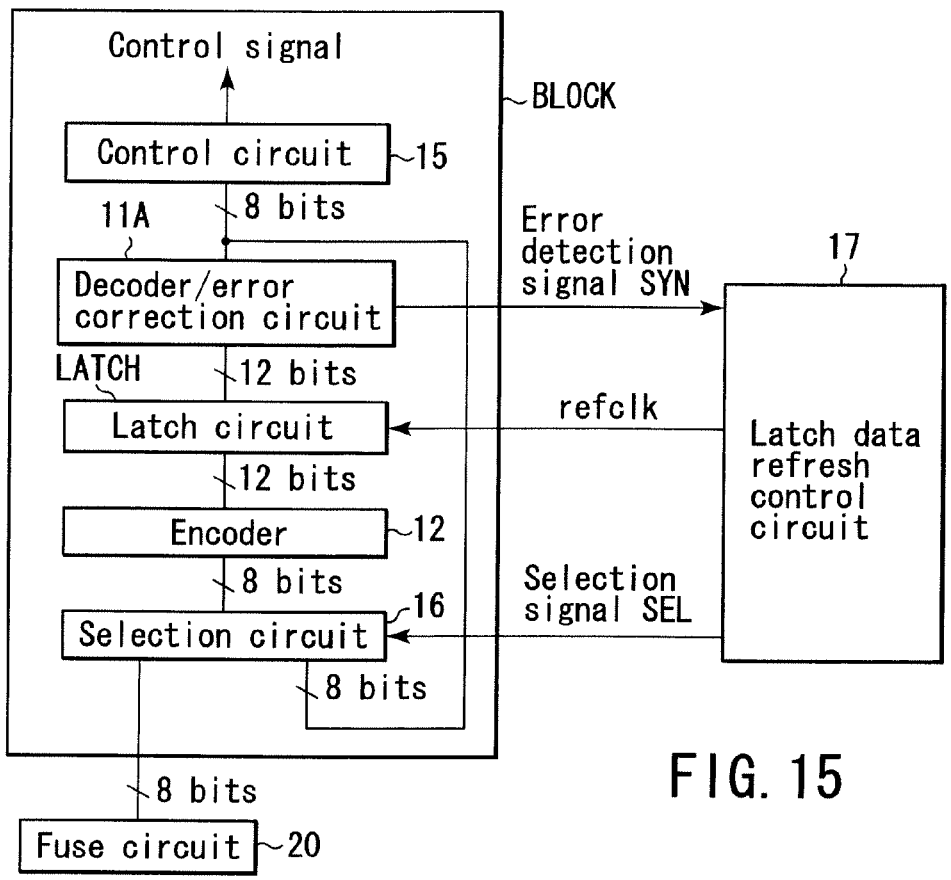
FIG. 15 is a view showing a semiconductor integrated circuit concerning a sixth embodiment.

FIG. 15 shows a semiconductor integrated circuit concerning the sixth embodiment.

The semiconductor integrated circuit of this example is firstly characterized in that a decoder/error correction circuit 11A and an encoder 12 are arranged so as to sandwich a latch circuit LATCH in a function block BLOCK and error detection/correction is performed with respect to data inversion (generation of erroneous data due to a soft error) in the latch circuit LATCH, and it is secondly characterized in that a write operation (latch data refresh operation) with respect to the latch circuits LATCH is again executed when data inversion is generated in the latch circuit LATCH so that correct data is constantly latched in the latch circuit LATCH.

As a result, for example, even if a value of one bit in 12-bit data latched in the latch circuit LATCH is inverted due to a soft error or the like, the erroneous data can be detected/corrected by the decoder/error correction circuit 11A. Therefore, the correct data can be constantly supplied to a control circuit 15.

Additionally, there is an upper limit in a capability of correcting erroneous data by the decoder/error correction circuit 11A. Correction up to, e.g., n (n is a natural number) bits is possible, but correction of bits exceeding the n bits is impossible (e.g., the error correction capability is one bit when using a (12, 8, 3)-shortened Hamming code).

Therefore, when an error of not more than n bits, e.g., one bit is generated, an error detection signal SYN is immediately outputted, and a latch data refresh operation to rewrite correct data in the latch circuits LATCH is performed. By doing so, erroneous data is not supplied to the control circuit 15 at all.

A concrete structure will now be described hereinafter.

One set (corresponding to eight bits) of fuse elements FUSE in a fuse circuit 20, which is eight fuse elements FUSE in this example, stores, e.g., data for the basic setting of chip operations or a remedy of a defective cell, a chip ID, security data and others. A selection circuit 16 selects any one of eight-bit data outputted from the fuse circuit 20 and eight-bit data outputted from the decoder/error correction circuit 11A based on a selection signal SEL, and outputs it to the encoder 12.

The eight-bit data outputted from the selection circuit 16 is encoded based on the Hamming Code (which is accurately a shortened Hamming code) in the encoder 12, and becomes 12-bit data (code word). Latch circuits LATCH latch the 12-bit data based on a refresh latch clock signal refclk. In this example, 12 latch circuits LATCH are provided in accordance with encoded 12-bit data outputted from the encoder 12.

The data of the latch circuits LATCH is inputted to the control circuit 15 through the decoder/error correction circuit 11A. The control circuit 15 executes the basic setting of chip operations based on output data from the decoder/erroneous correction circuit 11A.

Here, the decoder/error correction circuit 11A decodes the 12-bit data into the eight-bit data, and detects and corrects, e.g., an n-bit (n is a natural number) error when the n-bit error exists. Then, the decoded and corrected eight-bit data is supplied to the control circuit 15 as output data.

Further, the decoder/error correction circuit 11A outputs an error detection signal SYN when an n-bit error exists. Upon receiving the error detection signal SYN, a latch data refresh control circuit 17 outputs a selection signal SEL, and controls a selection circuit 16 so as to select an output signal from the decoder/error correction circuit 11A.

Furthermore, when a refresh latch clock signal refclk is supplied to the latch circuits LATCH, the latch circuits LATCH again latch the fed-back data, i.e., the 12-bit data obtained by encoding the output signal from the decoder/error correction circuit 11A (refresh operation).

As described above, in the sixth embodiment, after the eight-bit data read from the fuse circuit 20 is first encoded, the eight-bit data is latched in the latch circuits LATCH. Thereafter, every time the error detection signal SYN is outputted from the decoder/error correction circuit 11A, the eight-bit data outputted from the decoder/error correction circuit 11A is encoded and again latched in the latch circuits LATCH.

Therefore, even if the reliability of the latch circuits LATCH is low and some of the latch circuits LATCH do not hold correct data due to a soft error or the like, the correct data can be transferred to the control circuit 15 by utilizing the error correction function of the decoder/error correction circuit 11A provided for each block. Furthermore, by refreshing the data of the latch circuits LATCH every time erroneous data is generated, the number of erroneous bits in the latch circuits LATCH does not exceed the error correction capability (bit number) of the decoder/error correction circuit 11A, and the correct data can be constantly supplied to the control circuit 15.

(10) Seventh Embodiment

A semiconductor integrated circuit concerning a seventh embodiment will now be described hereinafter.

Figure 16:
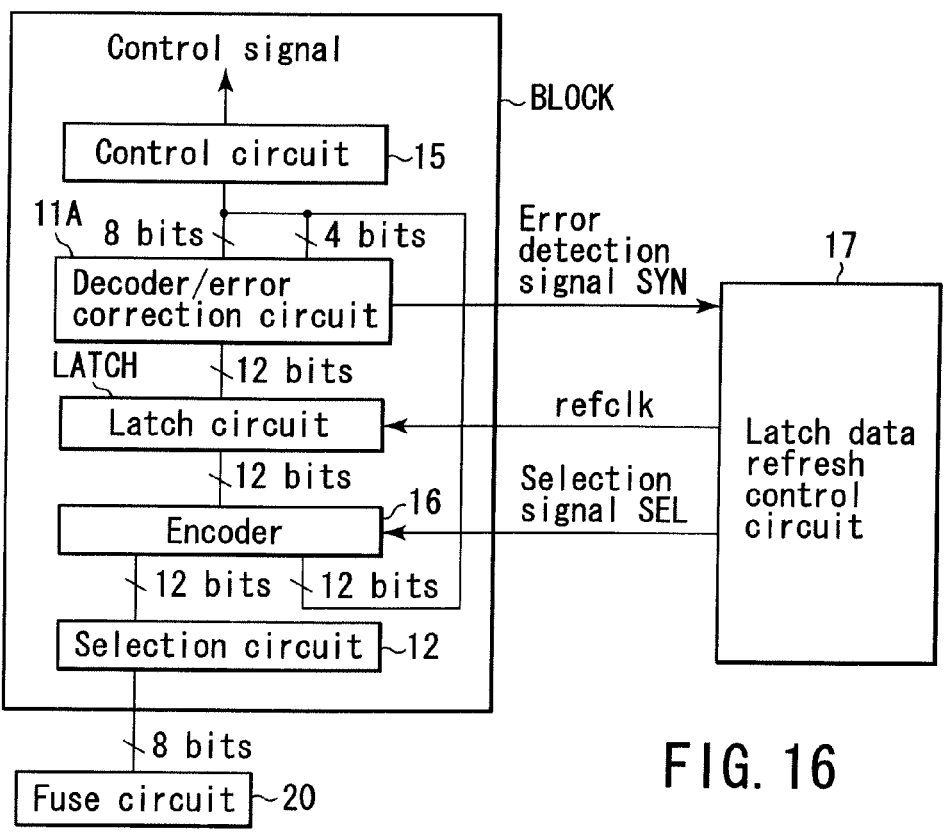
FIG. 16 is a view showing a semiconductor integrated circuit concerning a seventh embodiment.

FIG. 16 shows a semiconductor integrated circuit concerning the seventh embodiment.

The seventh embodiment is a modification of the sixth embodiment.

The semiconductor integrated circuit concerning the seventh embodiment is characterized in that a code word (12-bit data) is directly fed back from a decoder/error detection circuit 11A when refreshing latch data and the latch data is again latched in latch circuits LATCH as compared with the semiconductor integrated circuit concerning the sixth embodiment.

That is, in the sixth embodiment, as shown in FIG. 15, since the decoded eight-bit data is again encoded and supplied to the latch circuit LATCH, the selection circuit 16 is arranged before the encoder 12. On the other hand, in the seventh embodiment, as shown in FIG. 16, since a code word (12-bit data) is directly fed back from a decoder/error correction circuit 11A, a selection circuit 16 is arranged immediately before the latch circuit LATCH (between an encoder 12 and the latch circuit LATCH).

Therefore, in this example, the selection circuit 16 selectively outputs any one of 12-bit data outputted from the encoder 12 and 12-bit data outputted from the decoder/error correction circuit 11A based on the selection signal SEL.

It is to be noted that any other structure is the same as that in the sixth embodiment mentioned above, thereby eliminating its explanation.

Even in such a structure, like the sixth embodiment, first, an advantage that the correct data can be constantly supplied to the control circuit by correcting erroneous data due to a soft error generated in the latch circuit LATCH can be obtained. Second, it is possible to obtain an advantage that an error which exceeds the capability of the error correction circuit is no longer generated by immediately rewriting (refreshing) the correct data in the latch circuit LATCH when the error is generated.

(11) Eighth Embodiment

A semiconductor integrated circuit concerning an eighth embodiment will now be described hereinafter.

Figure 17:
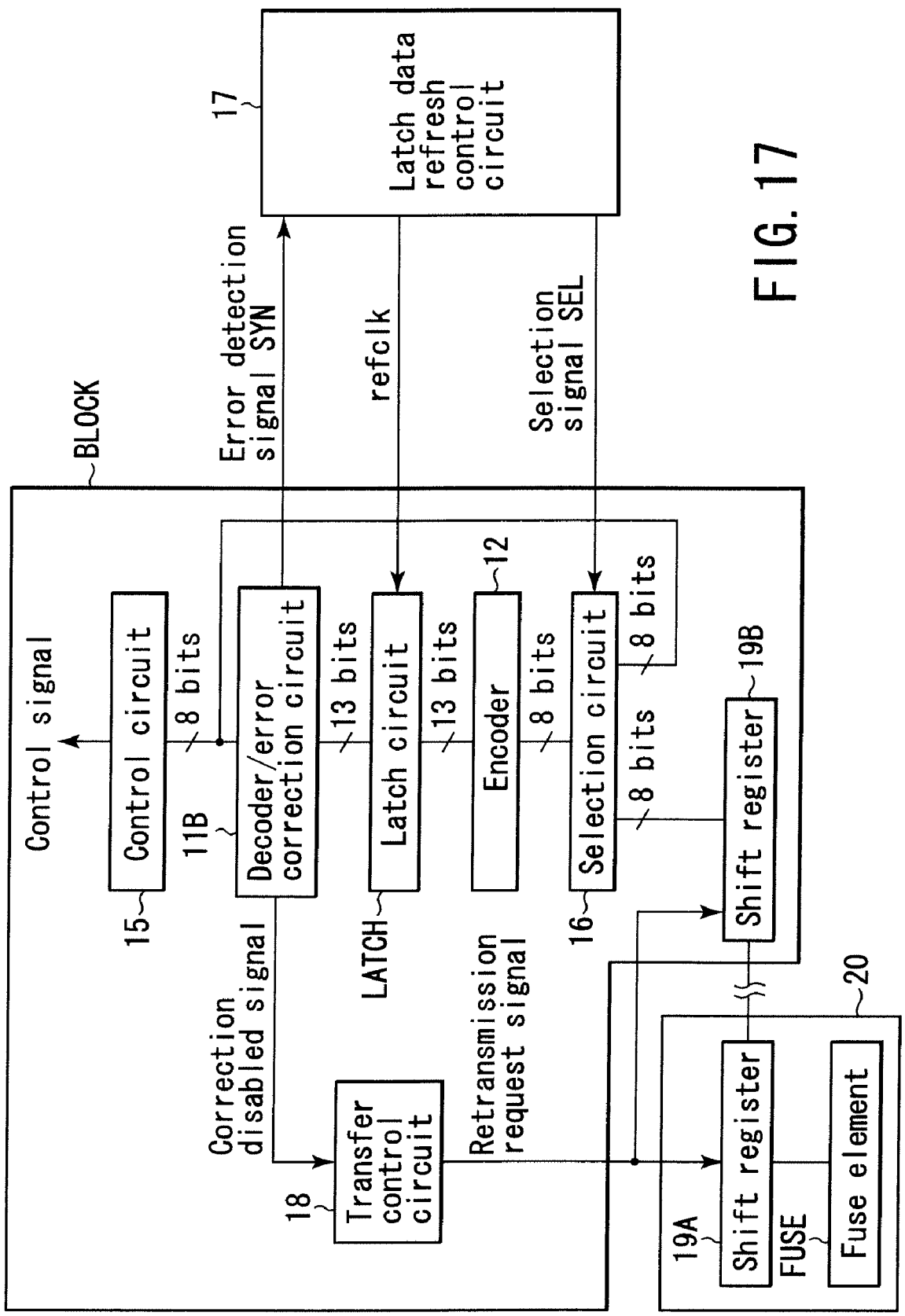
FIG. 17 is a view showing a semiconductor integrated circuit concerning an eighth embodiment.

FIG. 17 shows a semiconductor integrated circuit concerning the eighth embodiment.

As compared with the semiconductor integrated circuit concerning the sixth embodiment, the semiconductor integrated circuit concerning the eighth embodiment is characterized in that an error disabled signal is outputted when the number of bits of erroneous data is beyond a correction enabled range and error correction is impossible, correct data is again read from fuse elements FUSE (retransmission) and this data is encoded and latched in a latch circuit LATCH.

In regard to constituent elements, this semiconductor integrated circuit is firstly characterized in that a decoder/error correction circuit 11B has a function to output an error disabled signal, secondly that a transfer control circuit (retransmission request timing generation circuit) 18 is newly provided, and thirdly that shift registers 19A and 19B are used to transfer fuse data, as compared with the sixth embodiment.

The decoder/error correction circuit 11B decodes latch data, and performs error detection of the latch data. When there is an error of not less than one bit in the latch data, the decoder/error correction circuit 11B judges whether the error correction is possible. For example, when using, e.g., an (13, 8, 4) enlarged Hamming code whose Hamming distance is 4, namely, which is 1 capable of correcting an error and 2 capable of detecting an error, the error correction capability is one bit and the error detection capability is two bits.

Therefore, when it is detected that there is a one-bit error in the latch data due to, e.g., a soft error, this error can be corrected. Thus, like the sixth embodiment, the decoder/error correction circuit 11B outputs an error detection signal SYN. As a result, the error-corrected latch data, i.e., an output signal from the decoder/error correction circuit 11B is fed back, and again latched in the latch circuit LATCH.

On the other hand, when it is detected that there is a two-bit error in the latch data due to, e.g., a soft error, this error cannot be corrected. Thus, the decoder/error correction circuit 11B output a correction disabled signal. Upon receiving the correction disabled signal, the transfer control circuit (retransmission request timing generation circuit) 18 supplies a retransmission request signal to the shift registers 19A and 19B which are used to transfer the fuse data.

Upon receiving the retransmission request signal, the shift registers 19A and 19B again transfer the fuse data read from the fuse elements FUSE in the fuse circuit 20 from the fuse circuit 20 to the function block BLOCK. Assuming that erroneous data is generated only in the latch circuit LATCH, this fuse data is the correct data. Therefore, this data is encoded, and latched in the latch circuit LATCH.

As described above, in this embodiment, the encoded fuse data is latched, and the latch data is decoded. Thereafter, firstly, when an error is generated in the latch data in the circuit which transfers the latch data to the control circuit and this error can be corrected, the error-corrected data is fed back, and again latched as the latch data. Secondly, when an error is generated in the latch data and this cannot be corrected, the fuse data read from the fuse circuit is again latched as the latch data.

Even if the reliability of the latch circuits LATCH is low and some of the latch circuits LATCH do not hold correct data due to a soft error or the like, for example, the data in the latch circuits LATCH can be immediately refreshed into the correct data irrespective of the possibility/impossibility of error correction by adopting such a structure. Therefore, the correct data can be constantly transferred to the control circuit.

It is to be noted that the eighth embodiment can be naturally combined with the seventh embodiment.

In this case, it is good enough to provide a function to output a correction disabled signal to the decoder/error correction circuit 11A and newly provide a transfer control circuit (retransmission request timing generation circuit) 18 in the seventh embodiment.

(12) Ninth Embodiment

A semiconductor integrated circuit concerning a ninth embodiment will now be described hereinafter.

Figure 18:
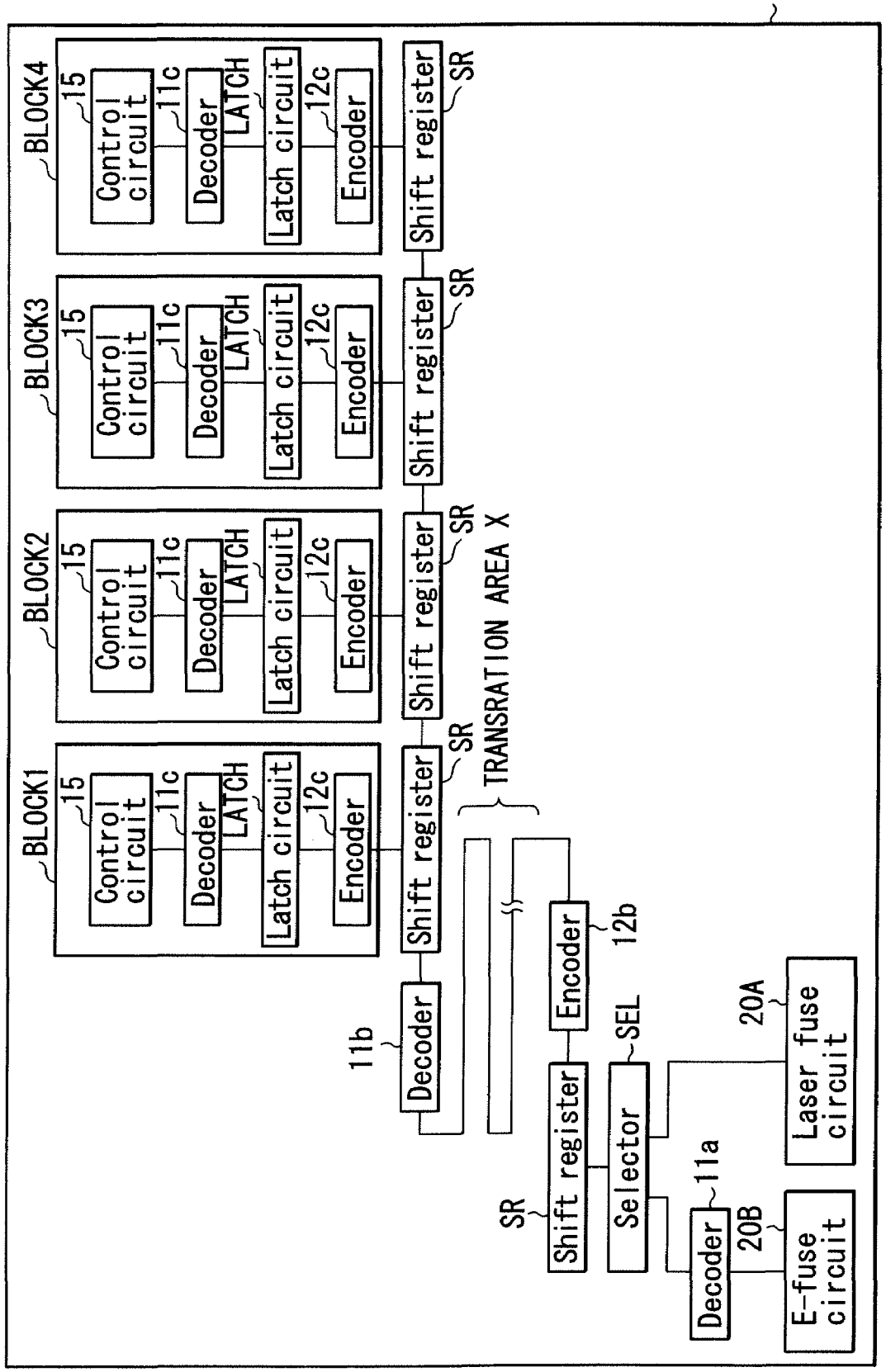
FIG. 18 is a view showing a semiconductor integrated circuit concerning a ninth embodiment.

FIG. 18 shows a semiconductor integrated circuit concerning the ninth embodiment.

The ninth embodiment relates to an application of the first to eighth embodiments mentioned above. The ninth embodiment illustrates how circuits concerning the examples of the present invention are used on a chip 10.

First, in regard to a fuse circuit, in case of, e.g., a laser fuse circuit 20A which performs programming of fuse elements by using a laser, since it can be considered that the reliability of fuse data is high, the fuse data does not have to be encoded and programmed.

However, in case of an E-fuse circuit 20B constituted of an electrical fuse that programming is carried out by disconnection of a wiring using an excessive current or an anti-fuse that programming is performed by dielectric breakdown using an excessive voltage, since it can be considered that the reliability of fuse data is low, the fuse data is encoded and programmed.

Specifically, an error correction code having an enough capability to obtain a sufficient yield is used in order to program its code word.

Then, data read from the E-fuse circuit 20B is decoded by using a decoder 11a.

Subsequently, in regard to a transfer path of fuse data, when fuse circuits 20A and 20B are greatly distanced from a control circuit 15 which uses fuse data and a wiring length (transfer path TRANSRATION AREA X of fuse data) of wirings connecting the both circuits is very long, influences of skew of respective sets of data, noises due to coupling and others are taken into consideration, and an encoder 12b is connected to a first part of the transfer path whilst a decoder 11b is connected to a last part of the transfer path.

It is to be noted that the transfer path of the fuse data may have a structure which transfers data in serial or a structure which transfers data in parallel. The ninth embodiment is an example which performs serial transfer of the fuse data by using a shift register SR.

When performing serial transfer of a very large amount of data, it is often the case that using a convolution code is more advantageous than using a block code.

At last, in regard to a latch circuit LATCH which latches fuse data, when the reliability of the latch circuit LATCH with respect to a soft error is insufficient, an encoder 12c is arranged immediately before the latch circuit LATCH, and a decoder 11c is arranged immediately after the same. The fuse data supplied from the shift register SR is encoded, and then latched in the latch circuit LATCH. Further, the latch data latched in the latch circuit LATCH is decoded by the decoder 11c and then supplied to a control circuit 15.

It is to be noted that the ninth embodiment has a structure that the latch data is supplied to each of the function blocks BLOCK 1, 2, 3 and 4 and all the function blocks BLOCK have latch circuits LATCH, but the circuit concerning the examples of the present invention may be applied to only at least one of the function blocks.

(13) 10th Embodiment

A semiconductor integrated circuit concerning a 10th embodiment will now be described hereinafter.

Figure 19:
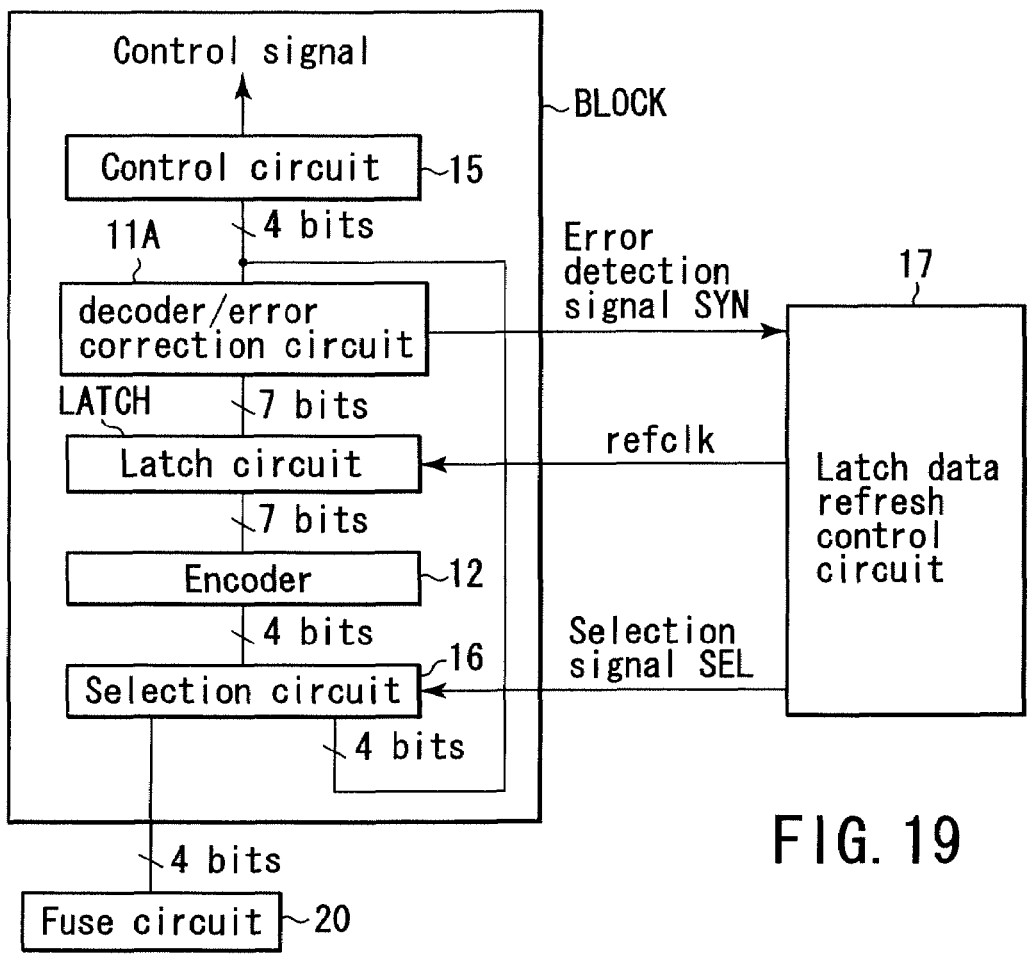
FIG. 19 is a view showing a semiconductor integrated circuit concerning a 10th embodiment.

FIG. 19 shows a semiconductor integrated circuit concerning the 10th embodiment.

In regard to a circuit configuration, the 10th embodiment is the same as the sixth embodiment (see FIG. 15) mentioned above. A difference of the 10th embodiment from the sixth embodiment lies in only the number of bits of fuse data or latch data. That is, in the 10th embodiment, a circuit scale of the circuit relating to the examples of the present invention is decreased by reducing the number of bits of the fuse data or the latch data with respect to the sixth embodiment, and a control circuit which is the essentiality of this embodiment will be briefly described.

It is to be noted that the fuse data consists of four bits and the four-bit fuse data is converted into seven-bit data by an encoder 12 in the 10th embodiment. The encoded seven-bit data is latched in a latch circuit LATCH as latch data. The latch data is decoded by a decoder/error correction circuit 11A and becomes four-bit data.

(14) Circuit Example

A circuit example used in the semiconductor integrated circuit concerning the examples of the present invention will now be described. Here, in the first to 10th embodiments, the circuit configuration relating to the last 10th embodiment has the smallest number of bits of fuse data, and it is the simplest structure. Thus, a circuit example which is of a type corresponding to the 10th embodiment will be described hereinafter.

A. Fuse Circuit

Figure 20:
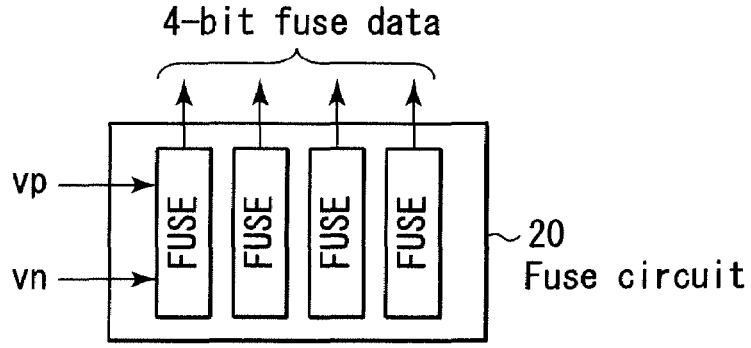
FIG. 20 is a view showing an example of a fuse circuit.
Figure 21:
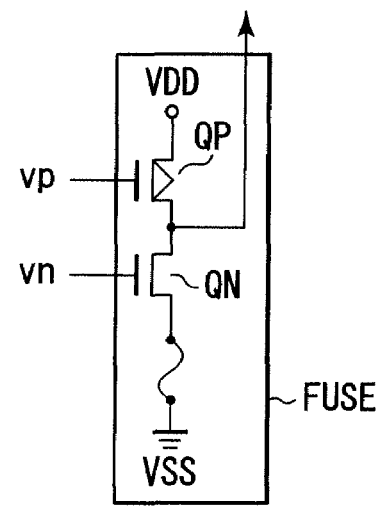
FIG. 21 is a view showing the example of the fuse circuit.

FIGS. 20 and 21 show an example of a fuse circuit.

A part of a fuse circuit 20 corresponding to one bit is constituted of a P channel MOS transistor QP and an N channel MOS transistor QN which are connected between a power supply terminal VDD and a ground terminal VSS, and a fuse element. A control signal vp is inputted to a gate of the MOS transistor QP, and a control signal vn is inputted to a gate of the MOS transistor QN.

Since a laser fusion type fuse circuit is presumed as this fuse circuit 20, a circuit used for programming does not exist. If an E-fuse circuit or an anti-fuse circuit is required, a new circuit used for programming must be added.

Figure 22:
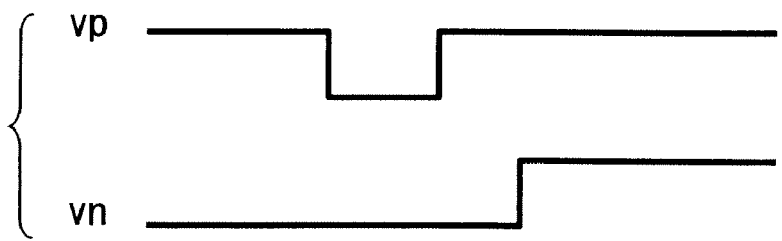
FIG. 22 is a view showing operation waveforms of the fuse circuit depicted in FIGS. 20 and 21.

When reading fuse data, control signals vp and vn are supplied to the fuse circuit 20 with such timings as shown in FIG. 22. In this example, the control signal vp is first changed to "L", and an output node is precharged to "H". Thereafter, when the control signal vn is changed to "L", a level of the output node demonstrates a change in accordance with a value of the fuse data.

For example, when the fuse element is not disconnected (conducting state), changing the control signal vn to "H" varies the level of the output node from "H" to "L". On the other hand, when the fuse element is disconnected (non-conducting state), the level of the output node maintains "H" even if the control signal vn is changed to "H".

B. Selection Circuit

Figure 23:
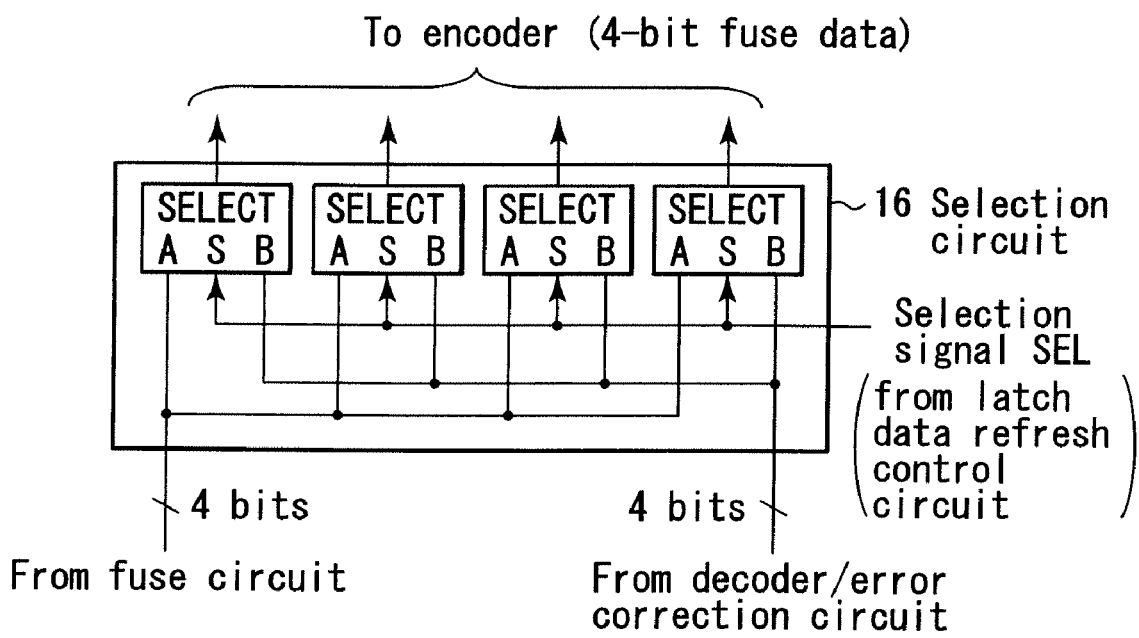
FIG. 23 is a view showing an example of a selection circuit.
Figure 24:
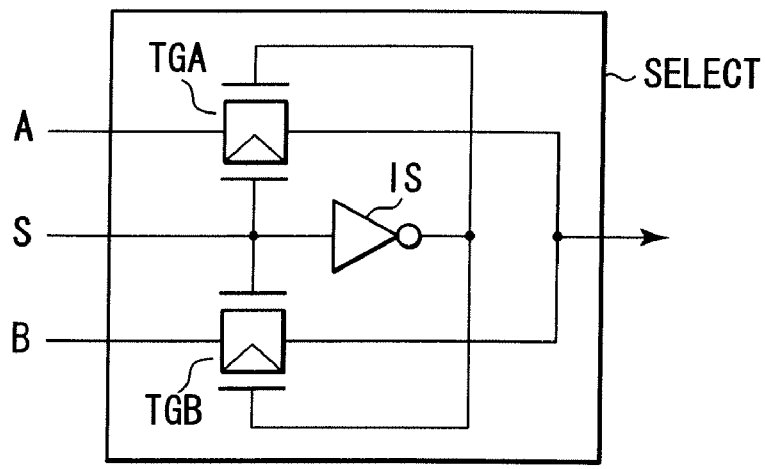
FIG. 24 is a view showing the example of the selection circuit.

FIGS. 23 and 24 show an example of a selection circuit.

A selection circuit 16 has four switch circuits SELECT in accordance with the number of bits of fuse data. The switch circuit SELECT selects any one of fuse data from the fuse circuit and data from the decoder/error correction circuit based on a selection signal SEL, and outputs it. The selection signal SEL is supplied from a latch data refresh control circuit.

The switch circuit SELECT is constituted of transfer gate circuits TGA and TGB and an inverter circuit IS. The four-bit data A from the fuse circuit or the four-bit data from the decoder/error correction circuit is selected in accordance with a value of the selection signal SEL.

C. Encoder

Figure 25:
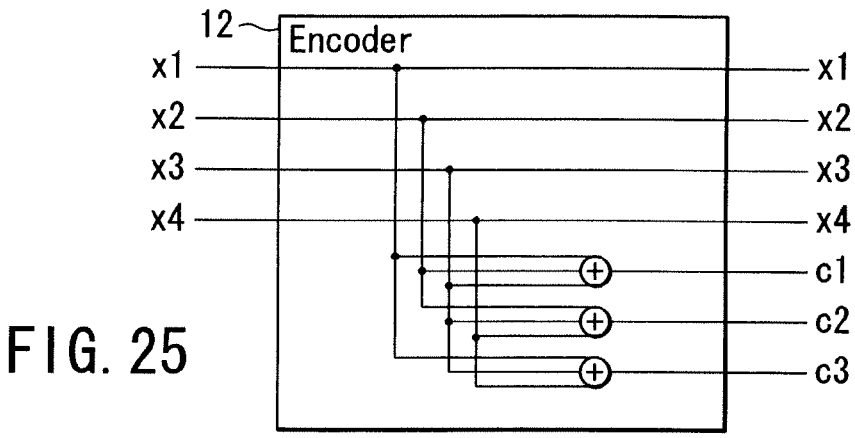
FIG. 25 is a view showing an example of an encoder.

FIG. 25 shows an example of an encoder.

An encoder 12 has an exclusive OR (Ex-OR) circuit. This exclusive OR circuit is used to generate seven-bit code words x1, x2, x3, x4, c1, c2 and c3.

D. Latch Circuit

Figure 26:
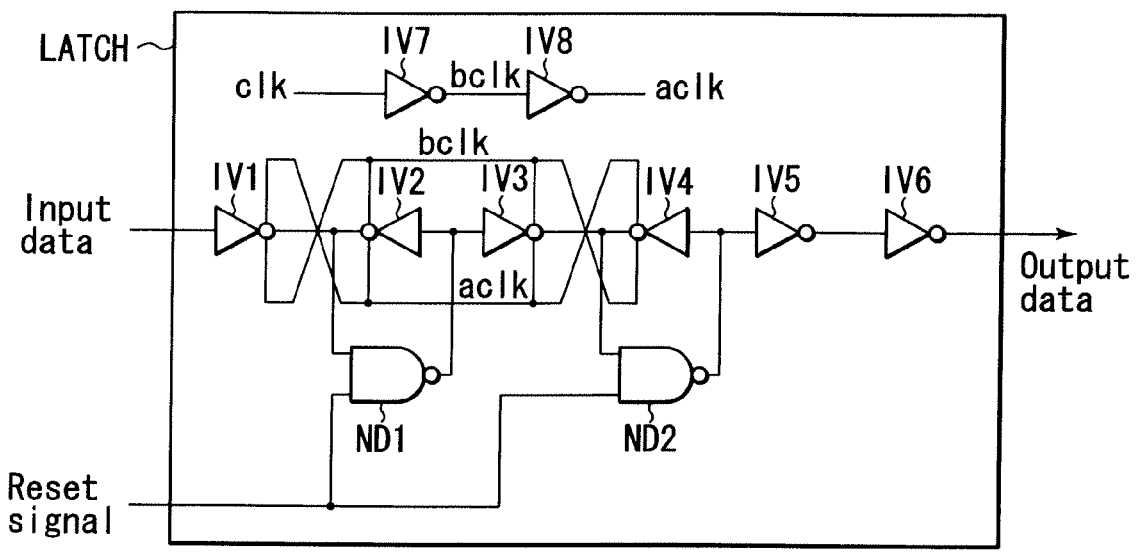
FIG. 26 is a view showing an example of a latch circuit.

FIG. 26 shows an example of a latch circuit.

This latch circuit has inverters IV1 to IV6 and NAND circuits ND1 and ND2. An operation of the latch circuit is controlled based on a clock signal clk. The clock signal clk is changed to a clock signal bclk when passing through an inverter IV7, and changed to a clock signal aclk when passing through inverters IV7 and IV8.

Figure 27:
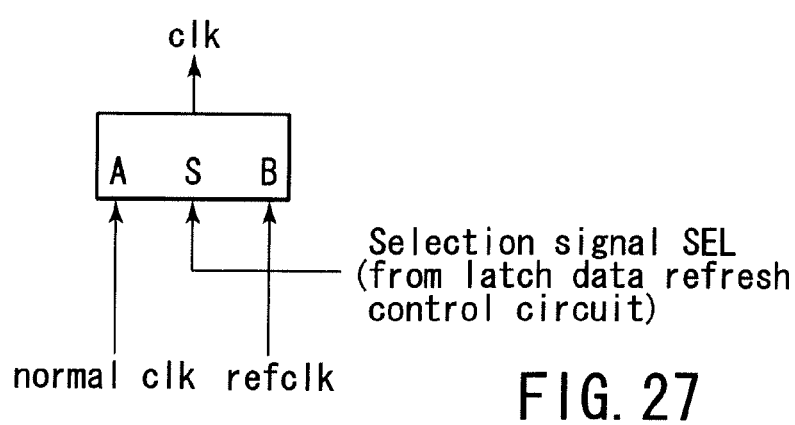
FIG. 27 is a view showing an example of a circuit which selects a clock.

In regard to the clock signal clk, for example, as shown in FIG. 27, when latching the fuse data, i.e., when latching the first fuse data and retransmission of the fuse data is requested, a normal clock signal normal clk is used. When refreshing the latch data, i.e., when again latching data outputted from the decoder/error correction circuit, a refresh latch clock signal refclk is used.

Switching between the normal clock signal normal clk and the fresh latch clock signal refclk is performed by using the selection signal SEL outputted from the latch data refresh control circuit.

It is to be noted that input data is actually latched in a first latch portion consisting of the inverter IV2 and the NAND circuit ND1 which are flip-flop-connected, and a second latch portion consisting of the inverter IV4 and the NAND circuit ND2 which are flip-flop-connected.

A reset signal is inputted to the NAND circuits ND1 and ND2, and used when resetting the latch data.

E. Decoder/Error Correction Circuit

Figure 28:
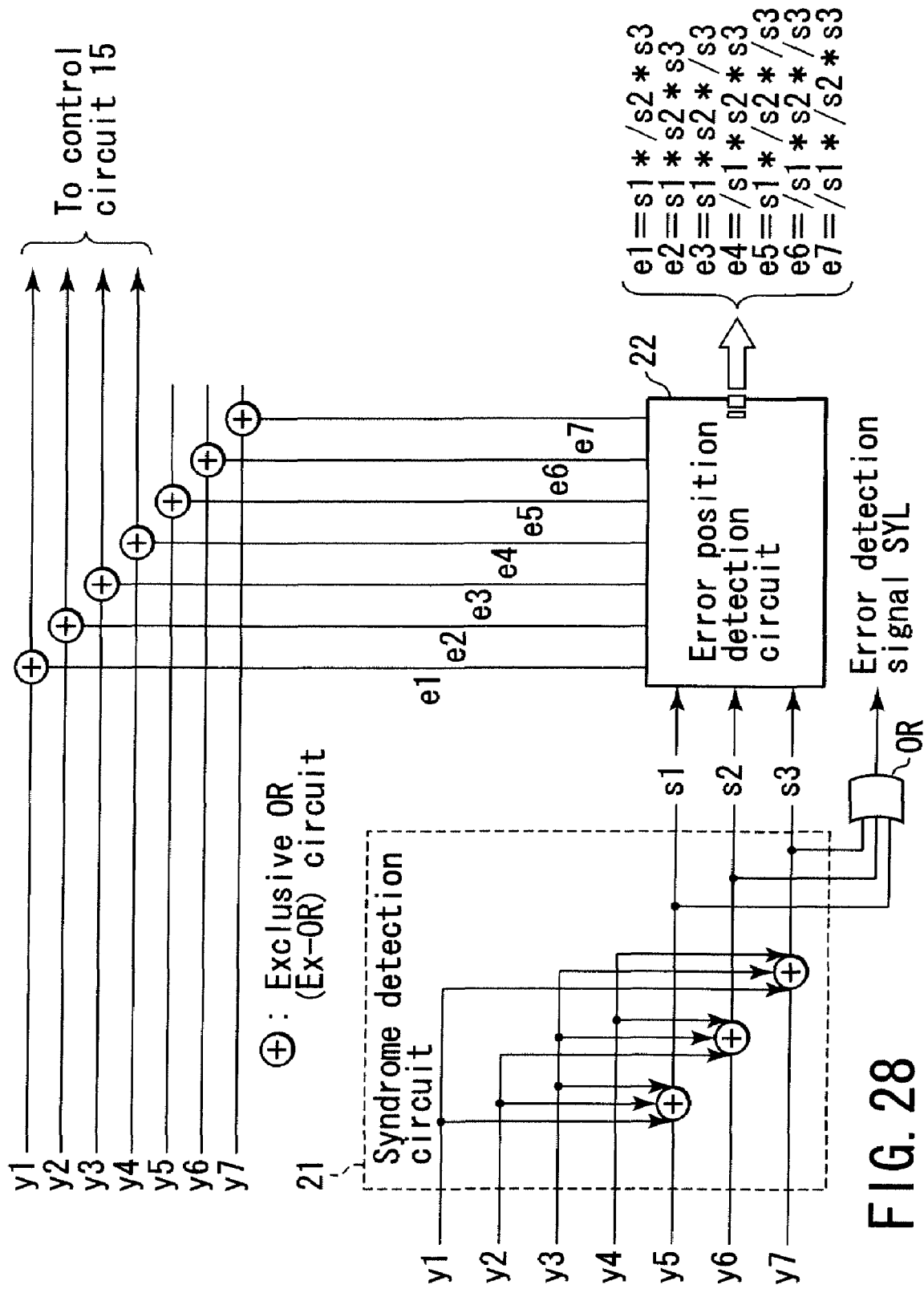
FIG. 28 is a view showing an example of a decoder/error correction circuit.

FIG. 28 shows an example of a decoder/error correction circuit.

The decoder/error correction circuit has a syndrome detection circuit 21, an error position detection circuit 22, an exclusive OR (Ex-OR) circuit and an OR circuit (OR). The syndrome detection circuit 21 generates signals s1, s2 and s3 used to detect errors from seven-bit code words y1, y2, y3, y4, y5, y6 and y7. When OR of the signals s1, s2 and s3 is taken, a detection signal SYN indicative of whether an error exists can be obtained.

The error position detection circuit 22 detects a position of an erroneous bit based on output signals s1, s2 and s3 of the syndrome detection circuit 21. When exclusive OR of output signals (error position detection signals) e1, e2, e3, e4, e5, e6 and e7 from the error position detection circuit 22 and the seven-bit code words y1, y2, y3, y4, y5, y6 and y7 is taken, an error bit is corrected to a correct bit.

Here, the error position detection signals e1, e2, e3, e4, e5, e6 and e7 can be generated by taking AND of output signals s1, s2 and s3 from the syndrome detection circuit 21 and their inversion signals /s1, /s2 and /s3. It is to be noted that a symbol "⨯" in FIG. 28 means that an AND logic is executed.

F. Latch Data Refresh Control Circuit

Figure 29:
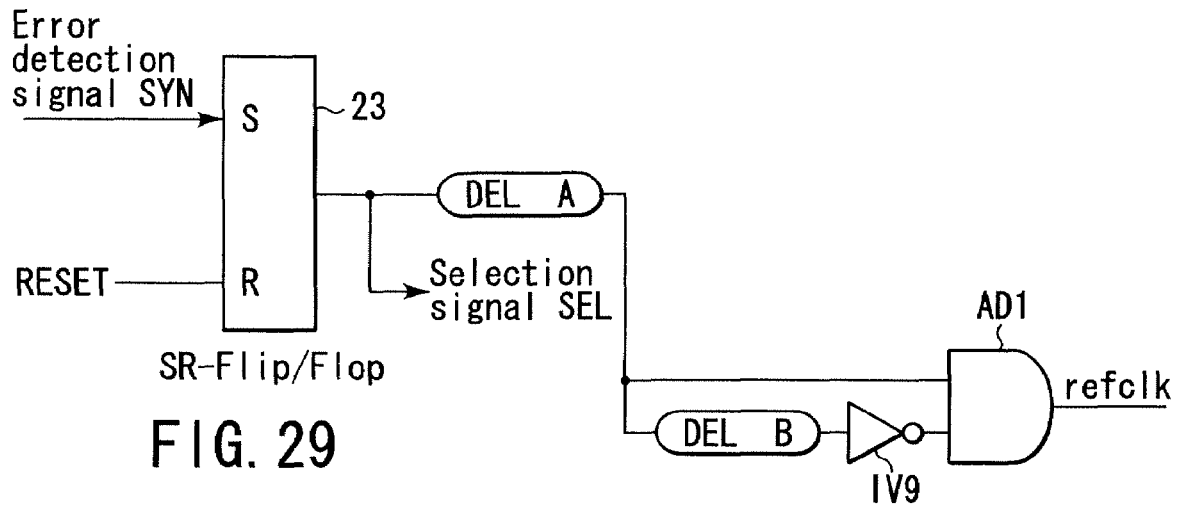
FIG. 29 is a view showing an example of a latch data refresh control circuit.

FIG. 29 shows an example of a primary part of a latch data refresh control circuit.

An error detection signal SYN and a reset signal RESET are inputted to a set/reset flip-flop circuit (SR-Filp/Fiop) 23. An output signal from the set/reset flip-flop circuit 23 becomes a selection signal SEL. The selection signal SEL is changed to a refresh latch clock signal refclk when passing through delay circuits DEL A and DEL B, an inverter IV9 and an AND circuit AD1.

Figure 30:
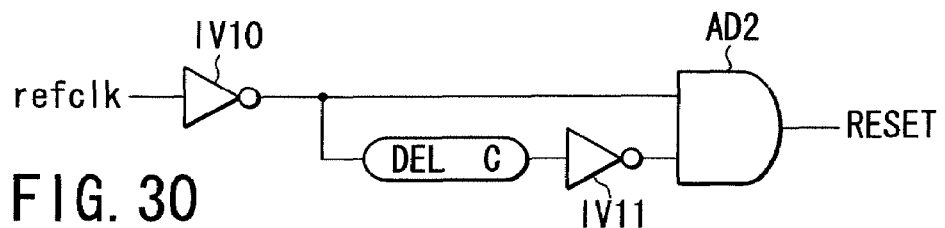
FIG. 30 is a view showing the example of the latch data refresh control circuit.

Furthermore, as shown in FIG. 30, the refresh latch clock signal refclk becomes a reset signal RESET when passing through a delay circuit DEL C, inverters IV10 and IV11 and an AND circuit AD2.

An operation of the latch data refresh control circuit will now be briefly described.

Figure 31:
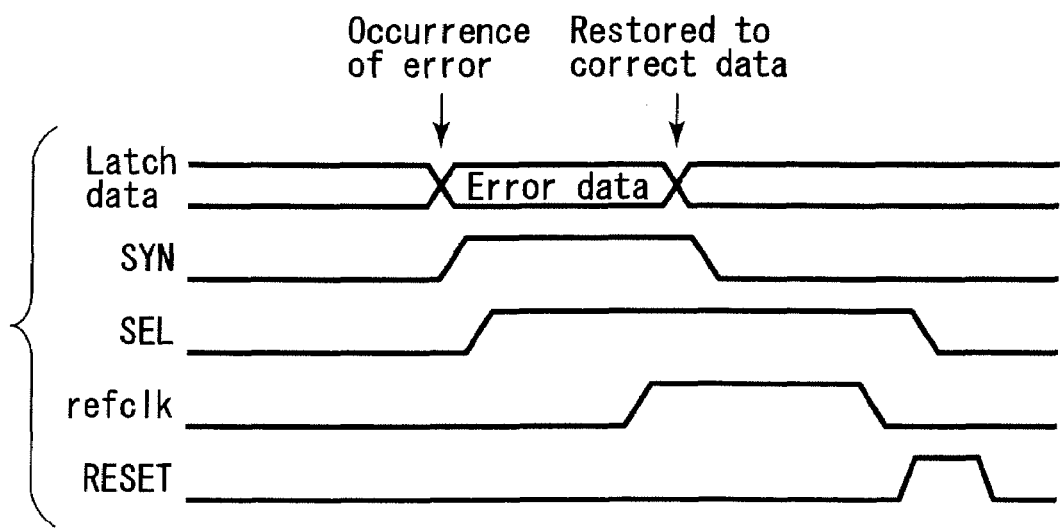
FIG. 31 is a view showing operation waveforms of the latch data refresh control circuit depicted in FIGS. 29 and 30.

FIG. 31 shows operation waveforms of the latch data refresh control circuit.

When an error is generated in the latch data, the error detection signal SYN is changed to "H". In response to this, the latch data refresh control circuit outputs a selection signal (pulse signal) SEL (="H"), and outputs a refresh latch clock signal refclk. As a result, for example, the error-corrected data is again latched in the latch circuit (latch data refresh operation). Thereafter, the latch data refresh control circuit changes the reset signal RESET to "H".

3. Others

Although the description has been given as to the case that the data is read from the fuse circuit using a laser fusion type fuse, a current fusion type fuse, a dielectric breakdown anti-fuse or the like in the foregoing embodiments, it is needless to say that the examples of the present invention can be applied to a case that data concerning operations of the internal circuits, redundancy data, a chip ID, security data and others are stored in the memory element which stores data by injecting electric charges into a control gate by using a hot carrier phenomenon or a tunnel current.

Furthermore, the examples of the present invention can be applied to various kinds of semiconductor integrated circuit, e.g., a logic LSI such as ASIC, a system LSI constituted of a plurality of function blocks, a memory mixed LSI, a microprocessor, a semiconductor memory and others.

The examples of the present invention are effective to a semiconductor product in which data concerning the basic setting of chip operations or the like must be programmed in a non-volatile memory element in a chip, e.g., a laser fusion type fuse, an current fusion type fuse and a dielectric breakdown type anti-fuse before or after a packaging step, and which requires an improvement of the reliability.

According to the semiconductor integrated circuit concerning an aspect of the present invention, even if erroneous data is read from the non-volatile memory such as a fuse element or even if erroneous data is generated in the transfer path or the latch circuit, such data can be corrected, thereby correctly performing the basic setting of chip operations, a remedy of a defective cell, reading of a chip ID and security data and others.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general invention concept as defined by the appended claims and their equivalents.

What is claimed is:

1. A semiconductor integrated circuit, comprising:
    a non-volatile memory element; and
    memory blocks that are operated independently,
    each memory block including
        a memory cell array,
        a shift register that receives data from the non-volatile memory element,
        a latch circuit that latches data from the shift register, and
        a control circuit that controls an operation of the memory cell array based on data latched in the latch circuit, wherein the operation comprises chip setting operations,
    the shift registers of the memory blocks are connected in series, and define a transfer path, and
    one end of the transfer path is connected to the non-volatile memory element.

2. The semiconductor integrated circuit according to claim 1, further comprising:
    a decoder connected between the transfer path and the non-volatile memory element, wherein the non-volatile memory element stores encoded data, and the decoder decodes the encoded data from the non-volatile memory element.

3. The semiconductor integrated circuit according to claim 1, wherein the non-volatile memory element stores encoded data, the latch circuit of each memory block latches the encoded data, and each of the memory blocks has a decoder which decodes the encoded data from the latch circuit.

4. The semiconductor integrated circuit according to claim 1, further comprising:
    an encoder that encodes data from the non-volatile memory element; and
    a decoder that decodes data from the encoder, wherein the latch circuit of each memory clock latches data from the decoder.

5. The semiconductor integrated circuit according to claim 1, further comprising:
    an encoder which encodes data from the non-volatile memory element, wherein the latch circuit of each memory block latches encoded data from the encoder, and each of the memory blocks has a decoder which decodes the encoded data form the latch circuit.

6. The semiconductor integrated circuit according to claim 1, wherein each of the memory blocks has an encoder connected between the shift register and the latch circuit, and a decoder connected between the latch circuit and the control circuit, wherein the encoder encodes data from the shift register, the latch circuit latches encoded data from the encoder, and the decoder decodes the encoded data form the latch circuit.

* * * * *